(12) United States Patent
Chikamoto

(10) Patent No.: US 10,603,902 B2
(45) Date of Patent: Mar. 31, 2020

(54) PRINT HEAD

(71) Applicant: SEIKO EPSON CORPORATION, Tokyo (JP)

(72) Inventor: Motonori Chikamoto, Nagano (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 16/112,951

(22) Filed: Aug. 27, 2018

(65) Prior Publication Data

US 2019/0061344 A1    Feb. 28, 2019

(30) Foreign Application Priority Data

Aug. 28, 2017  (JP) .................................. 2017-163529

(51) Int. Cl.
*B41J 2/045*     (2006.01)
*H01L 41/04*    (2006.01)
(Continued)

(52) U.S. Cl.
CPC ....... *B41J 2/04541* (2013.01); *B41J 2/04581* (2013.01); *B41J 2/04588* (2013.01);
(Continued)

(58) Field of Classification Search
CPC .. B41J 2/1618; B41J 2/04501; B41J 2/04541; B41J 2/04581; B41J 2/14201; B41J 2/1623; B41J 2/04596; B41J 2/04588; B41J 2/04593; B41J 2/14233; B41J 2002/14241; B41J 2002/14362; B41J 2002/14419;
(Continued)

(56) References Cited

U.S. PATENT DOCUMENTS 7,441,874 B2 * 10/2008 Sugahara ............. B41J 2/14233
                                                          347/50
7,527,361 B2 *  5/2009 Sugahara ............. B41J 2/14233
                                                          347/68
(Continued)

FOREIGN PATENT DOCUMENTS

JP    2017-024281 A    2/2017
JP    2018-051946 A    4/2018

OTHER PUBLICATIONS

The Extended European Search Report for the corresponding European Patent Application No. 18191101.7 dated Feb. 1, 2019.

*Primary Examiner* — Thinh H Nguyen
(74) *Attorney, Agent, or Firm* — Global IP Counselors, LLP

(57) ABSTRACT

A print head includes an ejection unit that ejects liquid when a piezoelectric element is driven; a driving IC that includes a circuit element and wiring, and that controls driving of the ejection unit; a relay substrate that transfers a signal for controlling driving of the piezoelectric element; that is physically coupled to the driving IC and the relay substrate, and that electrically couples the driving IC and the relay substrate to each other by using an electrode arranged on a surface of a resin; and that is physically coupled to the driving IC and the relay substrate, and that does not electrically couple the driving IC and the relay substrate to each other by using an electrode arranged on a surface of a resin, wherein the energization bump overlap the circuit element or the wiring, and the inspection bump not overlap the circuit element and the wiring.

14 Claims, 10 Drawing Sheets

(51) Int. Cl.
  *B41J 2/14* (2006.01)
  *H01L 41/053* (2006.01)
  *B41J 2/16* (2006.01)

(52) U.S. Cl.
  CPC ....... *B41J 2/04593* (2013.01); *B41J 2/04596* (2013.01); *B41J 2/14201* (2013.01); *B41J 2/14233* (2013.01); *B41J 2/161* (2013.01); *B41J 2/1623* (2013.01); *H01L 41/042* (2013.01); *H01L 41/053* (2013.01); *B41J 2002/14241* (2013.01); *B41J 2002/14362* (2013.01); *B41J 2002/14419* (2013.01); *B41J 2002/14491* (2013.01); *B41J 2202/18* (2013.01)

(58) Field of Classification Search
  CPC ......... B41J 2002/14491; B41J 2002/18; H01L 41/042; H01L 41/053
  See application file for complete search history.

(56) References Cited

U.S. PATENT DOCUMENTS

2006/0170738 A1  8/2006  Kato
2018/0086074 A1  3/2018  Chikamoto

\* cited by examiner

PRINT HEAD

This application claims priority to Japanese Patent Application No. 2017-163529 filed on Aug. 28, 2017. The entire disclosure of Japanese Patent Application No. 2017-163529 is hereby incorporated herein by reference.

BACKGROUND

1. Technical Field

The present invention relates to a print head.

2. Related Art

There is known a print head including a driving integrated circuit (IC) and a plurality of piezoelectric elements provided for a plurality of nozzles in a one-to-one correspondence. The piezoelectric elements each are driven in accordance with a driving signal applied from the driving IC. Thus, the print head ejects liquid from the nozzles.

In recent years, a print head is manufactured by using micro electro mechanical systems (MEMS) technology. As the print head is downsized, a mounting method of joining a driving IC and a substrate by using a resin core bump in which an electrode is formed on a resin core is being developed. In such a mounting method, electric coupling between the driving IC and the substrate is not ensured unless the contact state between the driving IC and the substrate is appropriate, and a defect may occur in the print head. Thus, when the driving IC and the substrate are coupled to each other by using the resin core bump, it is required to accurately inspect continuity.

For example, JP-A-2017-024281 discloses a method of checking the continuity state of a resin core bump used for a recording head by using infrared rays.

In a print head, as the length of nozzle rows increases, more liquid can be ejected by a single operation, and the print speed can increase; and as the distance between the nozzle rows decreases, a landing shift of liquid droplets decreases, and printing can be performed with high precision. To satisfy print requests at high speed higher than 30 inches per minute (ipm) (hereinafter, merely referred to as high speed); and high precision higher than 1200 dots per inch (dpi) for multipath of serial type or higher than 600 dpi for line type (hereinafter, merely referred to as high precision), a print head desirably has a rectangular shape being long in a direction along nozzle rows and being short in a direction intersecting with the nozzle rows. Specifically, the number of nozzles that form the nozzle rows is desirably equal to or more than 400 nozzles, and the density thereof is desirably as high as more than 300 nozzles per inch. Owing to this, a driving IC and a substrate to which the driving IC is coupled are elongated, and the arrangement interval between electrodes in multiple resin core bumps that are provided for multiple nozzles are narrowed. With the inspection method of related art by emitting long-wavelength light such as infrared rays, even when the inspection is attempted by using the light transmitted through the inside of IC which is dense and downsized to drive many nozzles, it is difficult to correctly perform inspection because circuit blocks and wiring cut off the light.

SUMMARY

An advantage of some aspects of the invention is to provide a print head capable of improving efficiency of continuity inspection between a driving IC and a substrate which are coupled to each other by using a resin core bump, and to increase inspection accuracy.

The invention can be implemented as one of the following aspects and application examples.

APPLICATION EXAMPLE 1

According to a first aspect of the invention, a print head includes an ejection unit that ejects liquid when a piezoelectric element is driven; a driving IC that includes a circuit element and wiring, and that controls driving of the ejection unit; a relay substrate that transfers a signal for controlling driving of the piezoelectric element; an energization bump that is located between the driving IC and the relay substrate, that is physically coupled to the driving IC and the relay substrate, and that electrically couples the driving IC and the relay substrate to each other by using an electrode arranged on a surface of a resin; and an inspection bump that is located between the driving IC and the relay substrate, that is physically coupled to the driving IC and the relay substrate, and that does not electrically couple the driving IC and the relay substrate to each other by using an electrode arranged on a surface of a resin. The energization bump overlaps at least one of the circuit element and the wiring in a plan view. The inspection bump does not overlap the circuit element and the wiring in the plan view.

The signal for controlling the driving of the piezoelectric element may be a driving signal that is transferred at the relay substrate from the driving IC to the piezoelectric element to drive the piezoelectric element, or a control signal for controlling a timing at which the driving signal is applied to the piezoelectric element.

The print head according to the application example includes the energization bump that is located between the driving IC and the relay substrate, and that electrically couples the driving IC and the relay substrate to each other; and the inspection bump that is located between the driving IC and the relay substrate, and that does not electrically couple the driving IC and the relay substrate to each other. The inspection bump is arranged at a position so as not to overlap the circuit element and the wiring of the driving IC in the plan view. When the coupling between the driving IC and the relay substrate is inspected by emitting light having wavelengths that are transmitted through the driving IC on the driving IC, since the circuit element and the wiring of the driving IC are not arranged in a region of the driving IC corresponding to the position at which the inspection bump is arranged, a phenomenon in which the emitted light is reflected and attenuated by the circuit element and the wiring can be reduced, and the light can be efficiently emitted on the inspection bump. Therefore, the coupling state among the inspection bump, the relay substrate, and the driving IC can be accurately detected.

Moreover, with the print head according to the application example, both the energization bump that electrically couples the driving IC and the relay substrate to each other, and the inspection bump that does not electrically couple the driving IC and the relay substrate to each other are configured of electrodes formed on the surfaces of the resins. The energization bump and the inspection bump can have similar configurations, and can be manufactured by similar manufacturing methods. Variations in manufacturing, such as variations in size, of the energization bump and the inspection bump can be reduced. The coupling state between the driving IC and the relay substrate by the energization bump correlates with the coupling state between the driving IC and the relay substrate by the inspection bump. The coupling state of the energization bump can be inspected based on the coupling state between the driving IC and the relay substrate by the inspection bump. In this way, by detecting the coupling state between the driving IC and the relay substrate by the inspection bump, it is not required to inspect the coupling state between the driving IC and the relay substrate by the energization bump, and the time required for the continuity inspection between the driving IC and the relay substrate coupled by the plurality of resin core bumps can be reduced. As described above, the coupling state between the relay substrate and the driving IC can be accurately detected for the inspection bump. Thus, accuracy of the continuity inspection between the driving IC and the relay substrate coupled by the plurality of resin core bumps can be increased.

Furthermore, with the print head according to the application example, the inspection bump does not electrically couple the driving IC and the relay substrate to each other. That is, electric current does not flow to the inspection bump even when respective components of the print head including the driving IC and the relay substrate are in operation. Hence, self-heating due to joule heat does not occur in the inspection bump. Thus, thermal stress on the resin that configures the inspection bump is reduced. Even when the print head including the driving IC and the relay substrate is being driven, the load on the driving CI can be stably supported by the inspection bump, and the operation of the print head can become more stable.

APPLICATION EXAMPLE 2

With the print head according to the above-referenced application example, in this case, the driving IC may have a rectangular shape having a first short side, a second short side opposite to the first short side, a first long side, and a second long side opposite to the first long side.

With the print head according to the application example, even when the driving IC has the long rectangular shape having the short sides and the long sides, the coupling state of the energization bump to the driving IC and the relay substrate can be detected by representatively using the inspection bump. The time required for the continuity inspection can be reduced. Furthermore, since the circuit element and the wiring are not arranged at the position at which the inspection bump is arranged, the coupling state of the inspection bump to the relay substrate and the driving IC can be accurately detected.

APPLICATION EXAMPLE 3

With the print head according to the above-referenced application example, in this case, the inspection bump may include a plurality of inspection bumps, a first bump of the plurality of inspection bumps may be located between the first short side and a first line that connects a midpoint of the first long side and a midpoint of the second long side to each other, a second bump of the plurality of inspection bumps may be located between the first line and the second short side, and a line that connects the first bump and the second bump to each other may be non-orthogonal to the first line.

With the print head according to the application example, the inspection bump includes the first bump and the second bump, the first bump is arranged on the side near the first short side in the longitudinal direction of the driving IC, and the second bump is arranged on the side near the second short side in the longitudinal direction of the driving IC. In this way, since the coupling state between the driving IC and the relay substrate is detected by using the first bump and the second bump arranged in the longitudinal direction of the driving IC, a positional shift that occurs when the driving IC and the relay substrate are coupled to each other can be reduced. Since the shift between the coupling positions of the driving IC and the relay substrate is reduced based on the inspection bump, the shift between the coupling positions of the driving IC and the relay substrate coupled by the energization bump can be reduced. Thus, based on the coupling state of the inspection bump, the accuracy of the continuity inspection between the driving IC and the relay substrate that are electrically coupled to each other by the energization bump can be further increased.

Moreover, with the print head according to the application example, the line that connects the first bump and the second bump is non-orthogonal to the first line. That is, the first bump and the second bump are arranged asymmetrically about the first line. When at least one side of the driving IC rises from the relay substrate due to insufficient coupling, at least one of the asymmetrically arranged first and second bumps is not sufficiently coupled to the driving IC or the relay substrate. In other words, when both the asymmetrically arranged first and second bumps are sufficiently coupled to the driving IC and the relay substrate, the rise of each side of the driving IC from the relay substrate is reduced. In this case, the rise of each side of the driving IC from the relay substrate is reduced in the coupling of the energization bump to the driving IC and the relay substrate. Thus, based on the coupling state of the inspection bump, the accuracy of the continuity inspection between the driving IC and the relay substrate that are electrically coupled to each other by the energization bump can be further increased.

APPLICATION EXAMPLE 4

With the print head according to the above-referenced application example, in this case, a third bump of the plurality of inspection bumps may be located between a second line that passes through the first bump and that is parallel to the first short side, and a third line that passes through the second bump and that is parallel to the second short side.

With the print head according to the application example, the third bump which is one of the plurality of inspection bumps is provided, and the third bump is located between the first bump and the second bump in the longitudinal direction of the driving IC. As the driving IC extends long in the longitudinal direction, the driving IC may be curved in the longitudinal direction. Since the third bump is provided between the first bump and the second bump, and the coupling state between the driving IC and the relay substrate is detected by using the third bump in addition to the first bump and the second bump, the influence of the curve in the coupled state of the driving IC and the relay substrate can be reduced. That is, in the coupling between the driving IC and the relay substrate, a rise that occurs when the driving IC is curved can be reduced. Since the rise of the driving IC from the relay substrate caused by the curve of the driving IC is reduced, even for the coupling of the energization bump to the driving IC and the relay substrate, the influence of the rise is reduced. Thus, based on the coupling state of the inspection bump, the accuracy of the continuity inspection between the driving IC and the relay substrate that are electrically coupled to each other by the energization bump can be further increased.

APPLICATION EXAMPLE 5

With the print head according to the above-referenced application example, in this case, the first bump may be located between the first long side and a fourth line that connects a midpoint of the first short side and a midpoint of the second short side to each other, the second bump may be located between the fourth line and the second long side, a fourth bump of the plurality of inspection bumps may be located between the first line and the first short side, and between the fourth line and the second long side, and a fifth bump of the plurality of inspection bumps may be located between the first line and the second short side, and between the fourth line and the first long side.

With the print head according to the application example, the fourth bump and the fifth bump of the plurality of inspection bumps are further provided, and the first bump, the second bump, the fourth bump, and the fifth bump are located at four respective areas divided by the first line and the fourth line on the driving IC. As the driving IC extends long (elongated in the longitudinal direction), the driving IC may be twisted when the driving IC and the relay substrate are coupled to each other. Since the first bump, the second bump, the fourth bump, and the fifth bump are arranged in the four respective areas divided in the long-side direction and the short-side direction of the driving IC, and the coupling state between the driving IC and the relay substrate is detected based on the inspection bump, it can be detected whether the driving IC is twisted or not at the coupling between the driving IC and the relay substrate. Since the twist is reduced when the driving IC and the relay substrate are coupled to each other, even when the energization bump is coupled to the driving IC and the relay substrate, the influence of the twist is reduced. Thus, based on the coupling state of the inspection bump, the accuracy of the continuity inspection between the driving IC and the relay substrate that are electrically coupled to each other by the energization bump can be further increased.

APPLICATION EXAMPLE 6

With the print head according to the above-referenced application example, in this case, the first long side may have a length that is 10 times or more a length of the first short side.

In the case of the long driving IC having the length that is 10 times or more the length of the first short side, the driving IC is further warped. Even when one end of the driving IC is correctly arranged, if the arrangement involves a small error, a large shift occurs at the other end of the driving IC. Hence, it has been difficult to accurately arrange the driving IC on the relay substrate. With the print head according to the application example, even in the case of the long driving IC, the coupling state of the energization bump to the driving IC and the relay substrate can be detected by representatively using the inspection bump. The time required for the continuity inspection can be reduced. Furthermore, since the circuit element and the wiring of the driving IC are not arranged at the position at which the inspection bump is arranged, the coupling state of the inspection bump to the relay substrate and the driving IC can be accurately detected.

APPLICATION EXAMPLE 7

With the print head according to the above-referenced application example, in this case, a transmittance of infrared rays through a region of the driving IC where the circuit element and the wiring are not arranged may be higher than a transmittance of infrared rays through a region of the driving IC where at least one of the circuit element and the wiring is arranged.

Infrared rays may be emitted on the driving IC, light transmitted through or light reflected from the region where the circuit element and the wiring of the driving IC are not arranged (the region where the inspection bump is arranged) may be detected, and thus the coupling state of the inspection bump to the driving IC and the relay substrate can be detected. The light emitted on the area where the circuit element and the wiring are not arranged exhibits different reflection angles at a flat surface portion and a curved portion of the inspection bump. By detecting the coupling state of the inspection bump to the driving IC and the relay substrate based on the different reflection angles, it is not required to use a probe or the like for the continuity inspection between the driving IC and the relay substrate. Thus, a space for use of the probe or the like is not required. A further increase in the number of nozzles arranged on the print head, and an increase in the density can be attained.

With the print head according to the application example, the transmittance of infrared rays through the region where the circuit element and the wiring of the driving IC are not arranged and where the inspection bump for detecting the coupling state between the relay substrate and the driving IC is arranged is higher than the transmittance of infrared rays through the region where the circuit element and the wiring of the driving IC are arranged and where the energization bump is arranged. When the coupling state of the inspection bump to the driving IC and the relay substrate is detected by using infrared rays, the infrared rays are efficiently emitted on the inspection bump. Therefore, detection accuracy for the coupling state among the inspection bump, the relay substrate, and the driving IC can be increased. Thus, based on the coupling state of the inspection bump, the accuracy of the continuity inspection between the driving IC and the relay substrate that are electrically coupled to each other by the energization bump can be further increased.

APPLICATION EXAMPLE 8

With the print head according to the above-referenced application example, in this case, the inspection bump may be coupled to a non-doped region of the driving IC.

When a silicon substrate or the like that is a base member is doped with ions, the transmittance of the base member may be changed. With the print head according to the application example, since the inspection bump is coupled to the non-doped region, variations in transmittance of the driving IC (silicon substrate) can be reduced. Thus, variations can be reduced when the continuity inspection between the driving IC and the relay substrate that are electrically coupled to each other by using the energization bump can be reduced based on the coupling state of the inspection bump.

APPLICATION EXAMPLE 9

With the print head according to the above-referenced application example, in this case, the relay substrate may be arranged to protect the piezoelectric element.

With the print head according to the application example, since the relay substrate is arranged to protect the piezoelectric element, the piezoelectric element can be prevented from being degraded due to the influence of, for example, oxygen or moisture.

Moreover, with the print head according to the application example, the driving IC, the relay substrate that is coupled to the driving IC by using the plurality of bump electrodes, and the piezoelectric element are arranged close to one another. Thus, the resolution depending on the distance between the ejection units can be increased.

APPLICATION EXAMPLE 10

With the print head according to the above-referenced application example, in this case, the relay substrate may be provided with a circuit element and wiring, the energization bump may overlap at least one of the circuit element and the wiring of the relay substrate, and the inspection bump may not overlap the circuit element and the wiring of the relay substrate.

With the print head according to the application example, the energization bump overlaps the region where at least one of the circuit element and the wiring of the relay substrate is arranged, and the inspection bump overlaps the region where the circuit element and the wiring of the relay substrate are not arranged. When the coupling state between the driving IC and the relay substrate is inspected based on the transmitted light of the emitted light, the emitted light can be detected without being reflected or attenuated by the circuit element and the wiring of the relay substrate. Thus, the detection accuracy for the coupling state of the inspection bump using the transmitted light is increased.

APPLICATION EXAMPLE 11

With the print head according to the above-referenced application example, in this case, the ejection unit may include a plurality of ejection units, and the plurality of ejection units may be provided with a density of 300 ejection units or more per inch.

With the print head according to the application example, even in the case of the print head including the ejection units mounted with high density of 300 ejection units or more per inch, the coupling state of the energization bump to the driving IC and the relay substrate can be detected by representatively using the inspection bump. The time required for the continuity inspection can be reduced. Moreover, since the circuit element and the wiring are not arranged at the position at which the inspection bump is arranged, the coupling state of the inspection bump to the relay substrate and the driving IC can be accurately recognized.

APPLICATION EXAMPLE 12

With the print head according to the above-referenced application example, in this case, the energization bump and the inspection bump may be formed of electrodes arranged on surfaces of resins provided to protrude from the driving IC toward the relay substrate.

With the print head according to the application example, the resins forming the energization bump and the inspection bump are provided on the driving IC. In other words, the energization bump and the inspection bump are formed on a surface of the driving IC that is coupled to the relay substrate. In this way, since the energization bump and the inspection bump are formed on the same surface of the driving IC, the relative positions of the energization bump and the inspection bump can be fixed. The coupling between the driving IC and the relay substrate via the energization bump and the inspection bump can be easily performed.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention is described below with reference to the drawings. The drawings to be used are for the convenience of description. The embodiment described below does not limit the contents of the invention described in the claims. All configurations described below are not necessarily essential components of the invention.

For a print head according to the invention, an example of a print head that is applied to a liquid ejecting apparatus serving as a printer is described below.

1. OVERVIEW OF LIQUID EJECTING APPARATUS

Figure 1:
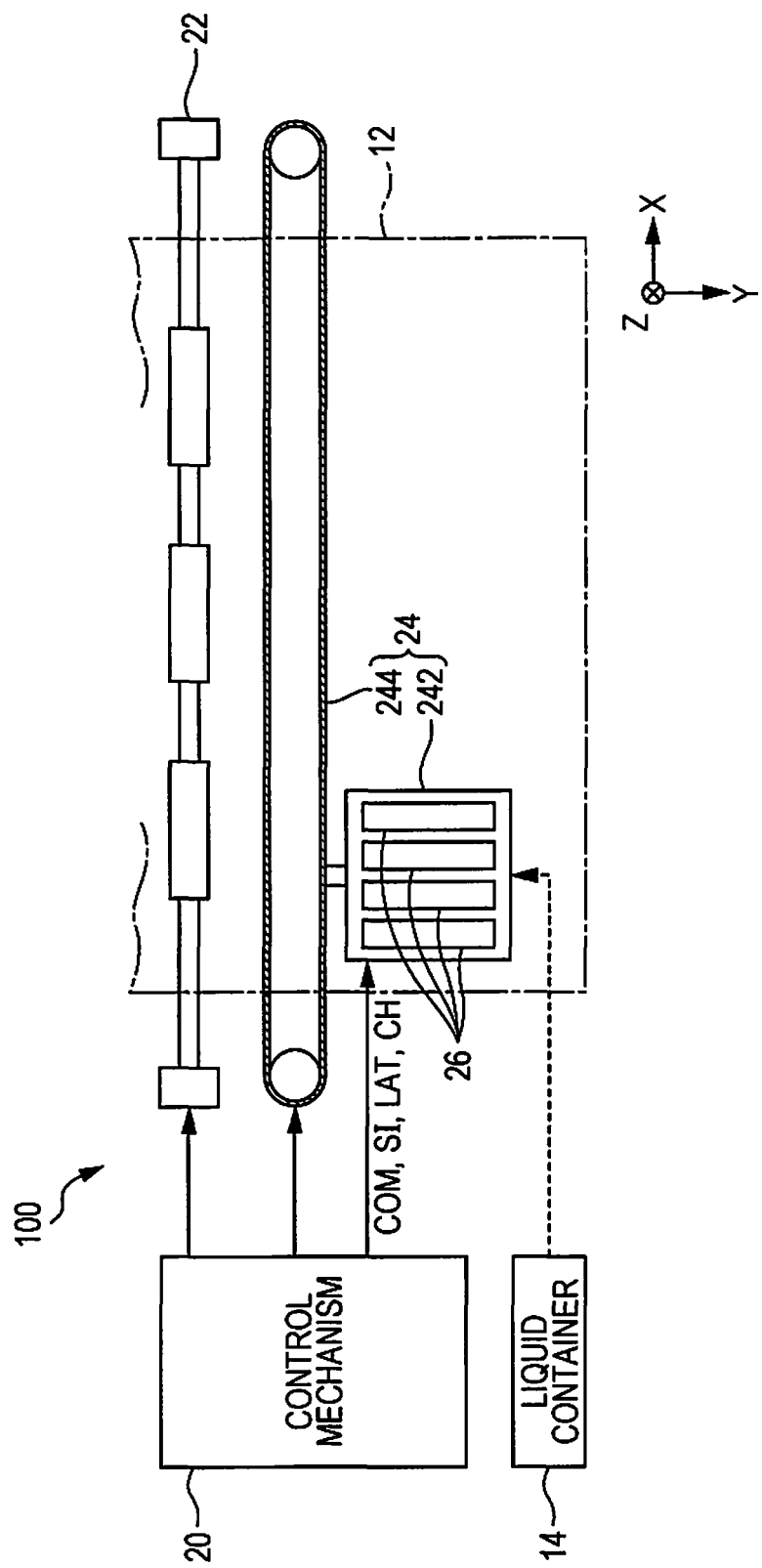
FIG. 1 is a configuration diagram showing a liquid ejecting apparatus.

FIG. 1 is a configuration diagram showing a liquid ejecting apparatus 100 to which a print head according to this embodiment is applied. The liquid ejecting apparatus 100 according to this embodiment is an ink jet printer that ejects ink to a medium 12. The ink is an example of liquid. The medium 12 is typically print paper. However, any print object, such as a resin film or a fabric, may be used as the medium 12.

As shown in FIG. 1, the liquid ejecting apparatus 100 includes a liquid container 14 that stores ink. The liquid container 14 may employ, for example, a cartridge attachable to and detachable from the liquid ejecting apparatus 100, a bag-shaped ink pack formed of a flexible film, or an ink tank that can be replenished with ink. The liquid container 14 stores a plurality of kinds of ink having different colors.

As shown in FIG. 1, the liquid ejecting apparatus 100 includes a control mechanism 20, a transport mechanism 22, a movement mechanism 24, and a plurality of print heads 26.

The control mechanism 20 includes, for example, a processing circuit, such as a central processing unit (CPU) or a field programmable gate array (FPGA), and a memory circuit such as a semiconductor memory. Thus the control mechanism 20 controls respective elements of the liquid ejecting apparatus 100. In this embodiment, the transport mechanism 22 transports the medium 12 to the +Y side under the control of the control mechanism 20. In the following description, the +Y side, and the −Y side which is a side opposite to the +Y side may be referred to as the Y-axis direction.

The movement mechanism 24 reciprocates the plurality of print heads 26 to the +X side, and the −X side opposite to the +X side under the control of the control mechanism 20. In this case, the +X side is in a direction intersecting with (typically, orthogonal to) the +Y side to which the medium 12 is transported. Hereinafter, the +X side and the −X side may be referred to as the X-axis direction. The movement mechanism 24 has a substantially box-shaped carriage 242 that houses the plurality of print heads 26; and an endless belt 244 to which the carriage 242 is fixed. Alternatively, the liquid container 14 may be mounted on the carriage 242 together with the print heads 26.

Each of the plurality of print heads 26 is supplied with ink from the liquid container 14. Moreover, each of the plurality of print heads 26 receives, from the control mechanism 20, a plurality of driving signals COM for driving the print head 26, a control signal SI for controlling the print head 26, a control signal LAT for controlling an ejection timing, and a control signal CH for controlling a timing at which a waveform is selected by time division from the plurality of driving signals COM. Each of the print heads 26 is driven based on the driving signals COM under the control based on the control signal SI, and causes a portion or the entirety of a number 2M of nozzles to eject ink to the +Z side (M is a natural number equal to or more than 1).

In this case, the +Z side is in a direction intersecting with (typically, orthogonal to) the +X side and the +Y side. In the following description, the +Z side, and the −Z side which is a side opposite to the +Z side may be referred to as the Z-axis direction. Each print head 26 forms a desirable image on a surface of the medium 12, by causing a portion or the entirety of the number 2M of nozzles to eject ink and allowing the ejected ink to be landed on the surface of the medium 12, in association with the transport of the medium 12 by the transport mechanism 22 and the reciprocation of the carriage 242.

2. CONFIGURATION OF PRINT HEAD

Figure 2:
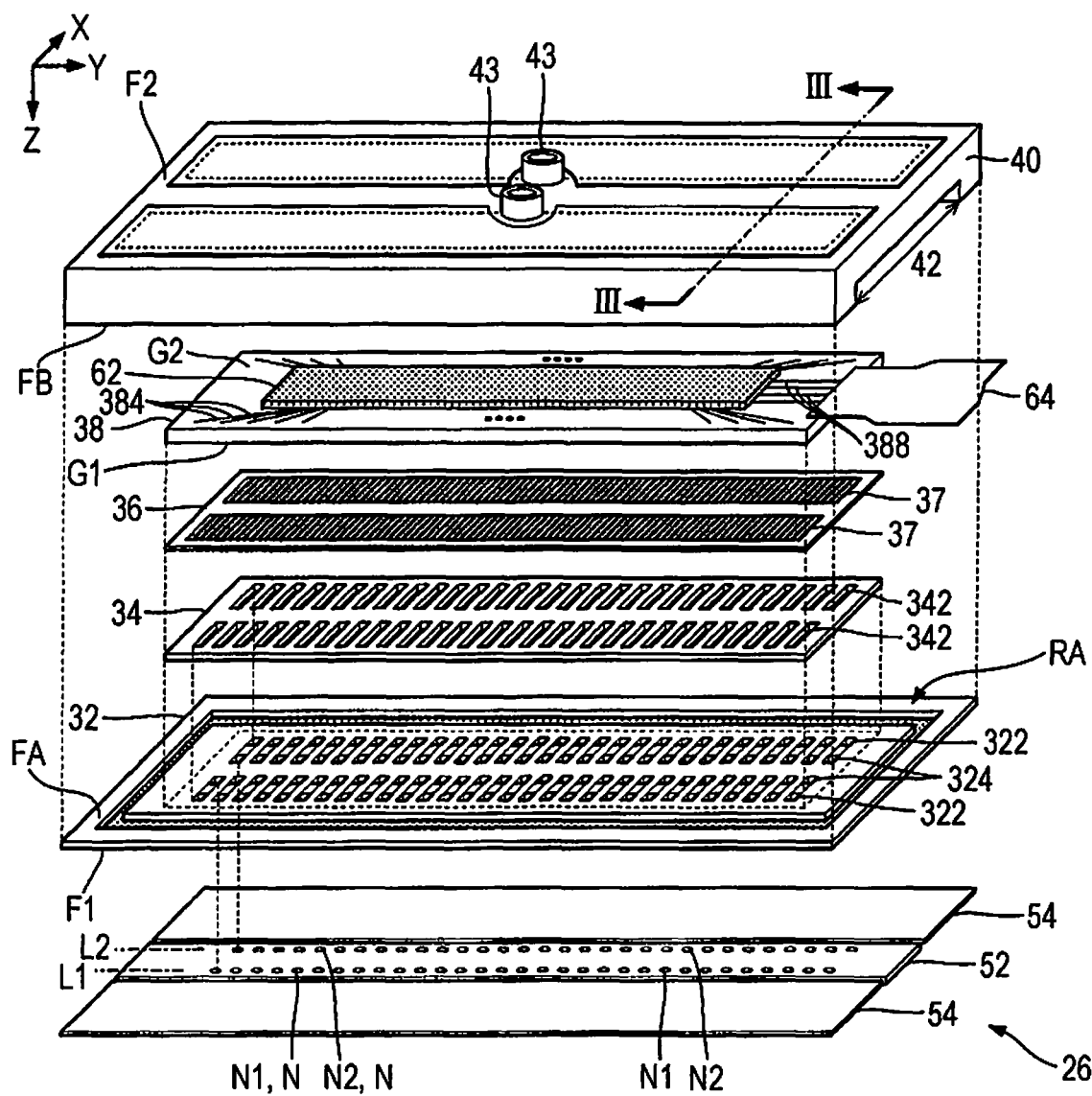
FIG. 2 is an exploded perspective view of a print head.
Figure 3:
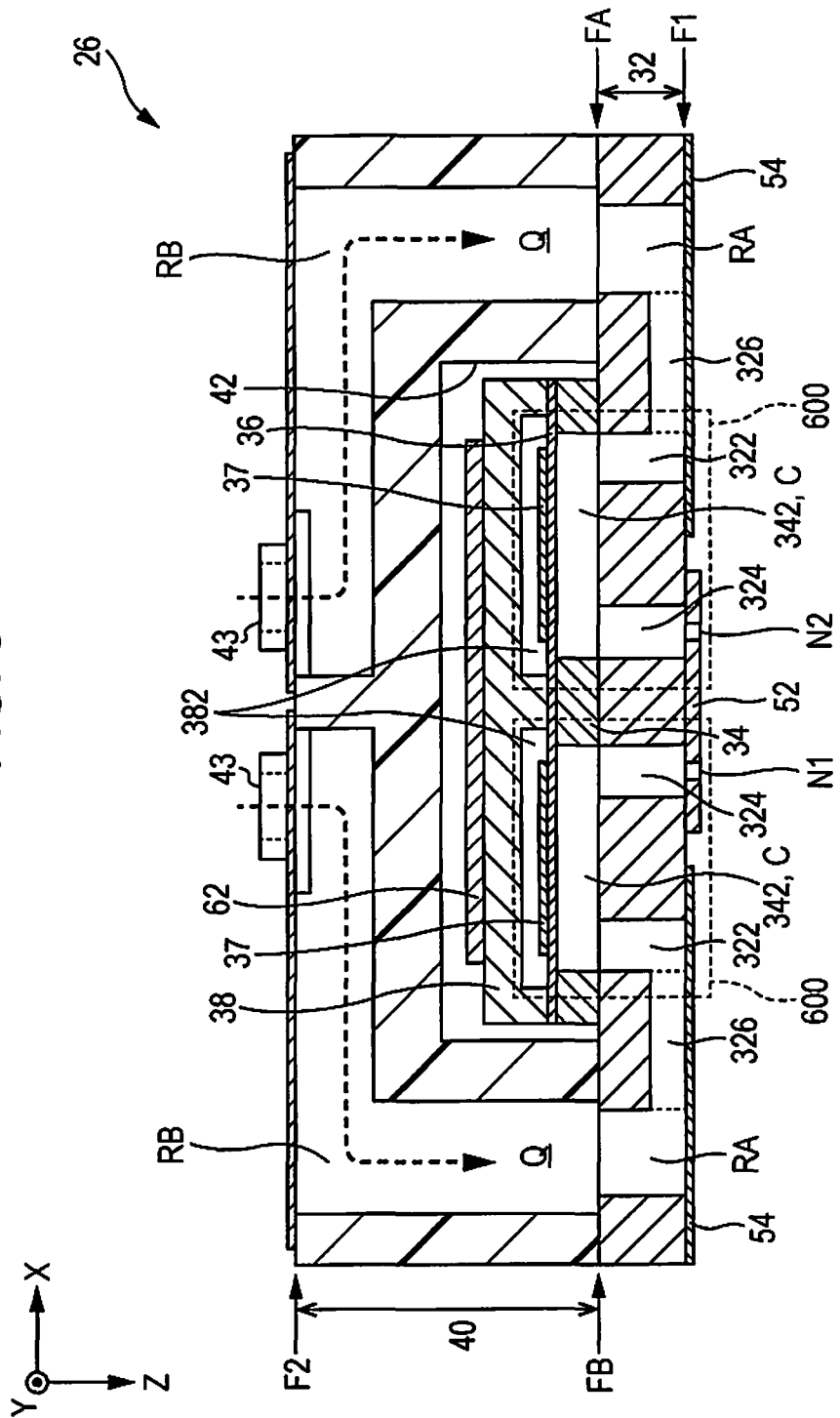
FIG. 3 is a cross-sectional view taken along line III-III in FIG. 2.

The configuration of the print head 26 is described now. FIG. 2 is an exploded perspective view of the print head 26. FIG. 3 is a cross-sectional view taken along line in FIG. 2.

As shown in FIG. 2, the print head 26 includes a number 2M of nozzles N arrayed in the Y-axis direction. In this embodiment, the number 2M of nozzles N are arrayed to be divided into two rows of a row L1 and a row L2. In the following description, each of a number M of nozzles N belonging to the row L1 may be referred to as nozzle N1, and each of a number M of nozzles N belonging to the row L2 may be referred to as nozzle N2. It is expected that as an example, the position of an m-th nozzle N1 of the number M of nozzles N1 belonging to the row L1 is substantially the same as the position of an m-th nozzle N2 of the number M of nozzles N2 belonging to the row L2 in the Y-axis direction (m is a natural number satisfying 1≤m≤M). In this case, "substantially the same" is conception involving a situation being completely the same, and a situation being apparently the same within tolerance. Alternatively, the number 2M of nozzles N may be arrayed in a zigzag manner or a staggered manner such that the position of the m-th nozzle N1 of the number M of nozzles N1 belonging to the row L1 is different from the position of the m-th nozzle N2 of the number M of nozzles N2 belonging to the row L2 in the Y-axis direction.

As shown in FIGS. 2 and 3, the print head 26 includes a channel substrate 32. The channel substrate 32 is a plate-shaped member having a surface F1 and a surface FA. The surface F1 is a surface on the medium 12 side when viewed from the print head 26. The surface FA is a surface opposite to the surface F1. A pressure-chamber substrate 34, a vibration portion 36, a plurality of piezoelectric elements 37, a protection member 38, and a casing 40 are provided on or above the surface FA. A nozzle plate 52 and a vibration absorber 54 are provided on the surface F1. Respective elements of the print head 26 are generally plate-shaped members long in the Y-axis direction. Respective components are stacked in the Z-axis direction and joined to one another by using, for example, an adhesive.

The nozzle plate 52 is a plate-shaped member, and has the number 2M of nozzles N formed therein. The nozzles N are through-holes. It is expected that the nozzle plate 52 has the number M of nozzles N corresponding to each of the row L1 and the row L2 with a density of 300 nozzles or more per inch.

The channel substrate 32 is a plate-shaped member that forms a channel of ink. As shown in FIGS. 2 and 3, the channel substrate 32 has a channel RA. Moreover, the channel substrate 32 has a number 2M of channels 322 and a number 2M of channels 324 to correspond to the number 2M of nozzles N in a one-to-one correspondence. The channels 322 and the channels 324 are openings formed to extend through the channel substrate 32 as shown in FIG. 3. The channels 324 communicate with the nozzles N corresponding to the channels 324. Furthermore, two channels 326 are formed in the surface F1 of the channel substrate 32. One of the two channels 326 is a channel that couples the channel RA to the number M of channels 322 corresponding to the number M of nozzles N1 belonging to the row L1, and the other one of the two channels 326 is a channel that couples the channel RA to the number M of channels 322 corresponding to the number M of nozzles N2 belonging to the row L2.

As shown in FIGS. 2 and 3, the pressure-chamber substrate 34 is a plate-shaped member having a number 2M of openings 342 to correspond to the number 2M of nozzles N in a one-to-one correspondence. The vibration portion 36 is provided on a surface of the pressure-chamber substrate 34 opposite to the channel substrate 32. The vibration portion 36 is a plate-shaped member the can vibrate.

As shown in FIG. 3, the vibration portion 36 opposes the surface FA of the channel substrate 32 with a space interposed therebetween at the inside of each opening 342. The space between the surface FA of the channel substrate 32 and the vibration portion 36 at the inside of the opening 342 functions as a pressure chamber C that applies a pressure to the ink filled in the space. The pressure chamber C is, for example, a space having a longitudinal direction in the X-axis direction and a transverse direction in the Y-axis direction. The print head 26 has a number 2M of pressure chambers C to correspond to the number 2M of nozzles N in a one-to-one correspondence. The pressure chambers C provided to correspond to the nozzles N1 in a one-to-one correspondence communicate with the channel RA through the channels 322 and the channels 326, and communicate with the nozzles N1 through the channels 324. The pressure chambers C provided to correspond to the nozzles N2 in a one-to-one correspondence communicate with the channel RA through the channels 322 and the channels 326, and communicate with the nozzles N2 through the channels 324.

As shown in FIGS. 2 and 3, a number 2M of piezoelectric elements 37 are provided on a surface of the vibration portion 36 opposite to the pressure chambers C, to correspond to the number 2M of pressure chambers C in a one-to-one correspondence. A driving signal Vout based on a plurality of driving signals COM is applied to one end of each piezoelectric element 37. A constant voltage signal VBS is applied to the other end of the piezoelectric element 37. The piezoelectric element 37 is deformed (driven) in accordance with a potential difference between the driving signal Vout and the constant voltage signal VBS. The vibration portion 36 vibrates in association with the deformation of the piezoelectric element 37. When the vibration portion 36 vibrates, the pressure in the pressure chamber C varies. Then, when the pressure in the pressure chamber C varies, the ink filled in the pressure chamber C is ejected through the channel 324 and the nozzle N. In this embodiment, it is expected that the driving signal Vout can drive the piezoelectric element 37 so that the ink is ejected from the nozzle N 30000 times or more per second.

Note that the pressure chamber C, the channels 322 and 324, the nozzle N, the vibration portion 36, and the piezoelectric element 37 function as an ejection unit 600 that ejects the ink filled in the pressure chamber C by driving of the piezoelectric element 37. That is, in the print head 26, a plurality of ejection units 600 are arranged in parallel two rows extending in the Y-axis direction.

The protection member 38 shown in FIGS. 2 and 3 are plate-shaped member that protects the number 2M of piezoelectric elements 37 formed on the vibration portion 36. The protection member 38 is provided on a surface of the vibration portion 36 or a surface of the pressure-chamber substrate 34.

The protection member 38 has two housing spaces 382 in a surface G1 which is a surface of the protection member 38 on the medium 12 side when viewed from the print head 26. One of the two housing spaces 382 houses the number M of piezoelectric elements 37 corresponding to the number M of nozzles N1. The other one of the two housing spaces 382 houses the number M of piezoelectric elements 37 corresponding to the number M of nozzles N2. The housing space 382 functions as "a protection space" in which the piezoelectric elements 37 are sealed to protect the piezoelectric elements 37 from being degraded due to influence of, for example, oxygen or moisture when the protection member 38 is arranged on the ejection units 600. Note that the width in the Z-axis direction (height) of each housing space 382 is sufficiently large so that the piezoelectric elements 37 do not contact the protection member 38 even when the piezoelectric elements 37 are displaced. Thus, even when the piezoelectric elements 37 are displaced, the noise caused by the displacement of the piezoelectric elements 37 is prevented from propagating to the outside of the housing space 382. The space that prevents the piezoelectric elements 37 from being degraded due to the influence of oxygen or moisture may be, for example, the housing space 382 (protection space) sealed by the protection member 38 as shown in FIG. 3, or a space sealed by the casing 40 or the like even when an opening is partly made between the protection member 38 and the surface G1. That is, the protection member 38 may be arranged on the surface G1 so as to protect the piezoelectric elements 37.

A driving IC 62 is provided on a surface G2 which is a surface of the protection member 38 opposite to the surface G1. The driving IC 62 receives the plurality of driving signals COM, and the control signals SI, LAT, and CH input to the print head 26. The driving IC 62 generates driving signals Vout by selecting supply or non-supply of the plurality of driving signals COM individually for the piezoelectric elements 37 based on the control signal SI, and outputs the driving signals Vout.

A number 2M of wiring 384 are formed on the surface G2 of the protection member 38 to correspond to the number 2M of piezoelectric elements 37 in a one-to-one correspondence, and are electrically coupled to the driving IC 62. The wiring 384 each are electrically coupled to the piezoelectric element 37 through a continuity hole extending through the protection member 38. Thus, the driving signal Vout output from the driving IC 62 is applied to the piezoelectric element 37 via the wiring 384, the continuity hole, and a connection terminal.

In addition, a plurality of wiring 388 are formed on the surface G2 of the protection member 38, and are electrically coupled to the driving IC 62. The plurality of wiring 388 are joined to a wiring member 64. The wiring member 64 has a plurality of wiring that transfer a plurality of signals input to the print head 26 to the driving IC 62. For example, the wiring member 64 may be a flexible printed circuit (FPC) or a flexible flat cable (FFC). The wiring 388 transfer the control signals SI, LAT, and CH, and the plurality of driving signals COM input from the wiring member 64 to the driving IC 62. Thus, the protection member 38 functions as a relay substrate on which the driving IC 62 is mounted, and that transfers a signal for controlling the driving of the piezoelectric elements 37. The details of electric coupling among the driving IC 62, the protection member 38, and the piezoelectric elements 37 are described later.

An operation of the driving IC 62 generating and outputting the driving signal Vout is described below. The driving IC 62 generates a driving signal Vout by selecting or not selecting one of the plurality of driving signals COM based on the control signals SI, LAT, and CH, and outputs the driving signal Vout that is applied to the piezoelectric element 37.

The control signal LAT determines a print period Ta that is a period of forming dots on the medium 12. Specifically, a period from when the control signal LAT rises to when the control signal LAT rises next is the print period Ta. The control signal CH divides the print period Ta into a plurality of sub-periods Tn (n is a positive integer). The control signal SI includes a data signal corresponding to each of the plurality of ejection units 600. The control signal SI selects or does not select one of the driving signals COM every sub-period Tn. Thus, the driving IC 62 generates the driving signal Vout for the print period Ta by selecting or not selecting one of the plurality of driving signals COM every sub-period Tn based on the control signal SI.

A procedure of the driving IC 62 generating driving signals Vout by using waveforms of two driving signals COM-A and COM-B shown in FIG. 4, as an example of a plurality of driving signals COM, is described below. The print period Ta in FIG. 4 includes two sub-periods of a sub-period T1 from when the control signal LAT rises to when the control signal CH rises, and a sub-period T2 from when the control signal CH rises to when the control signal LAT rises next.

The driving signal COM-A is a signal including a trapezoidal waveform Adp1 arranged in the sub-period T1, and a trapezoidal waveform Adp2 arranged in the sub-period T2. The trapezoidal waveforms Adp1 and Adp2 are substantially equivalent waveforms. When the trapezoidal waveforms Adp1 and Adp2 are applied to the one end of the piezoelectric element 37, the nozzle N of the corresponding ejection unit 600 ejects a medium amount of ink.

The driving signal COM-B is a signal including a trapezoidal waveform Bdp1 arranged in the sub-period T1, and a trapezoidal waveform Bdp2 arranged in the sub-period T2. The trapezoidal waveforms Bdp1 and Bdp2 are mutually different waveforms. The trapezoidal waveform Bdp1 causes ink near an opening of the nozzle N to micro-vibrates and prevents an increase in viscosity of the ink. Thus, even when the trapezoidal waveform Bdp1 is applied to the one end of the piezoelectric element 37, the nozzle N of the corresponding ejection unit 600 does not eject an ink droplet. The trapezoidal waveform Bdp2 is different from the trapezoidal waveform Adp1 (Adp2). When the trapezoidal waveform Bdp2 is applied to the one end of the piezoelectric element 37, the nozzle N of the corresponding ejection unit 600 ejects ink by a smaller amount than the medium amount.

The driving IC 62 generates a driving signal Vout by controlling which one of the driving signals COM-A and COM-B is applied to the piezoelectric element 37 of each of the plurality of ejection units 600, in the sub-period T1 and the sub-period T2, based on the control signal SI.

For example, when the control signal SI is a signal indicating "a large dot," the driving signal COM-A is selected in the sub-period T1 and the sub-period T2. Thus, the driving IC 62 outputs a driving signal Vout having a waveform in which the trapezoidal waveform Adp1 and the trapezoidal waveform Adp2 are continued in the print period Ta. In this case, the ejection unit 600 including the piezoelectric element 37 to which the driving signal Vout is applied ejects a medium amount of ink two times, and hence forms a large dot.

For example, when the control signal SI is a signal indicating "a medium dot," the driving signal COM-A is selected in the sub-period T1 and the driving signal COM-B is selected in the sub-period T2. Thus, the driving IC 62 outputs a driving signal Vout having a waveform in which the trapezoidal waveform Adp1 and the trapezoidal waveform Bdp2 are continued in the print period Ta. In this case, the ejection unit 600 including the piezoelectric element 37 to which the driving signal Vout is applied ejects a medium amount of ink and a small amount of ink, and hence forms a medium dot.

For example, when the control signal SI is a signal indicating "a small dot," none of the driving signals COM-A and COM-B is selected in the sub-period T1 and the driving signal COM-B is selected in the sub-period T2. Thus, the driving IC 62 outputs a driving signal Vout having the trapezoidal waveform Bdp2 in the print period Ta. In this case, the ejection unit 600 including the piezoelectric element 37 to which the driving signal Vout is applied ejects a small amount of ink, and hence forms a small dot.

When the control signal SI is a signal indicating "microvibration," the driving signal COM-B is selected in the sub-period T1, and none of the driving signals COM-A and COM-B is selected in the sub-period T2. Thus, the driving IC 62 outputs a driving signal Vout having the trapezoidal waveform Bdp1 in the print period Ta. In this case, the piezoelectric element 37 to which the driving signal Vout is applied is driven by a certain degree not ejecting ink, and the ejection unit 600 including the piezoelectric element 37 does not eject ink.

Figure 4:
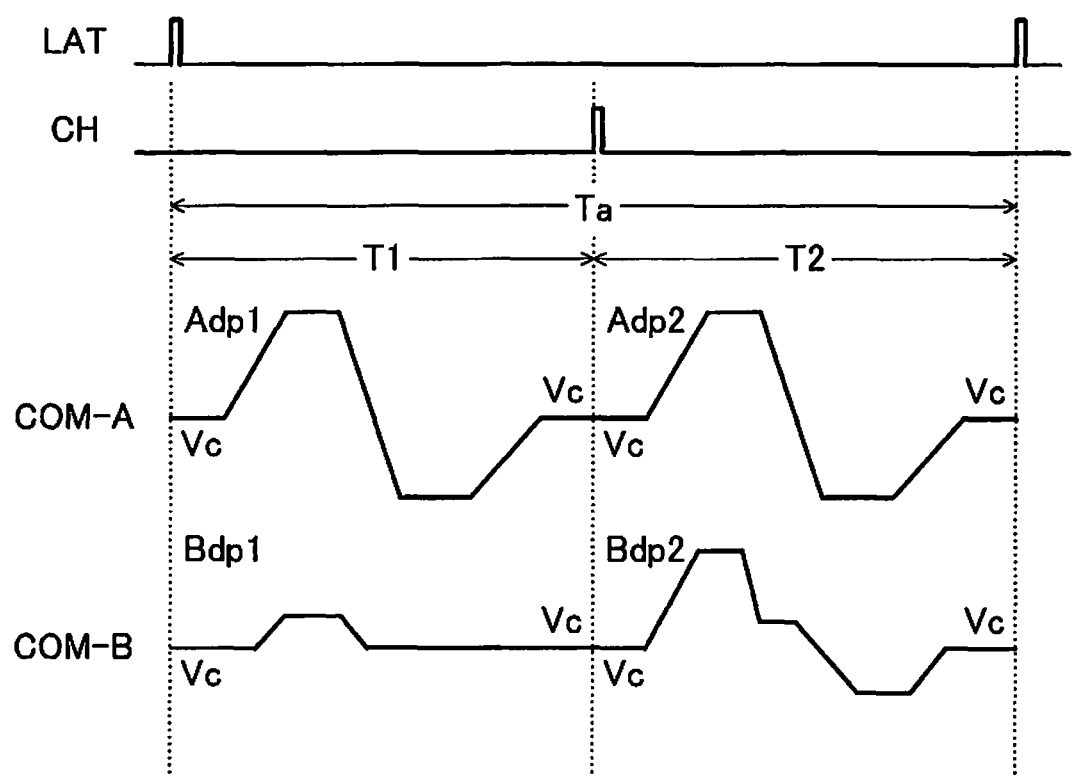
FIG. 4 shows an example of a plurality of driving signals COM.

Since the plurality of driving signals COM are configured as shown in FIG. 4, multiple levels of tone can be expressed with a simple configuration without additionally providing a driving circuit that generates a driving signal COM and a configuration that selects a plurality of driving signals COM.

Figure 5:
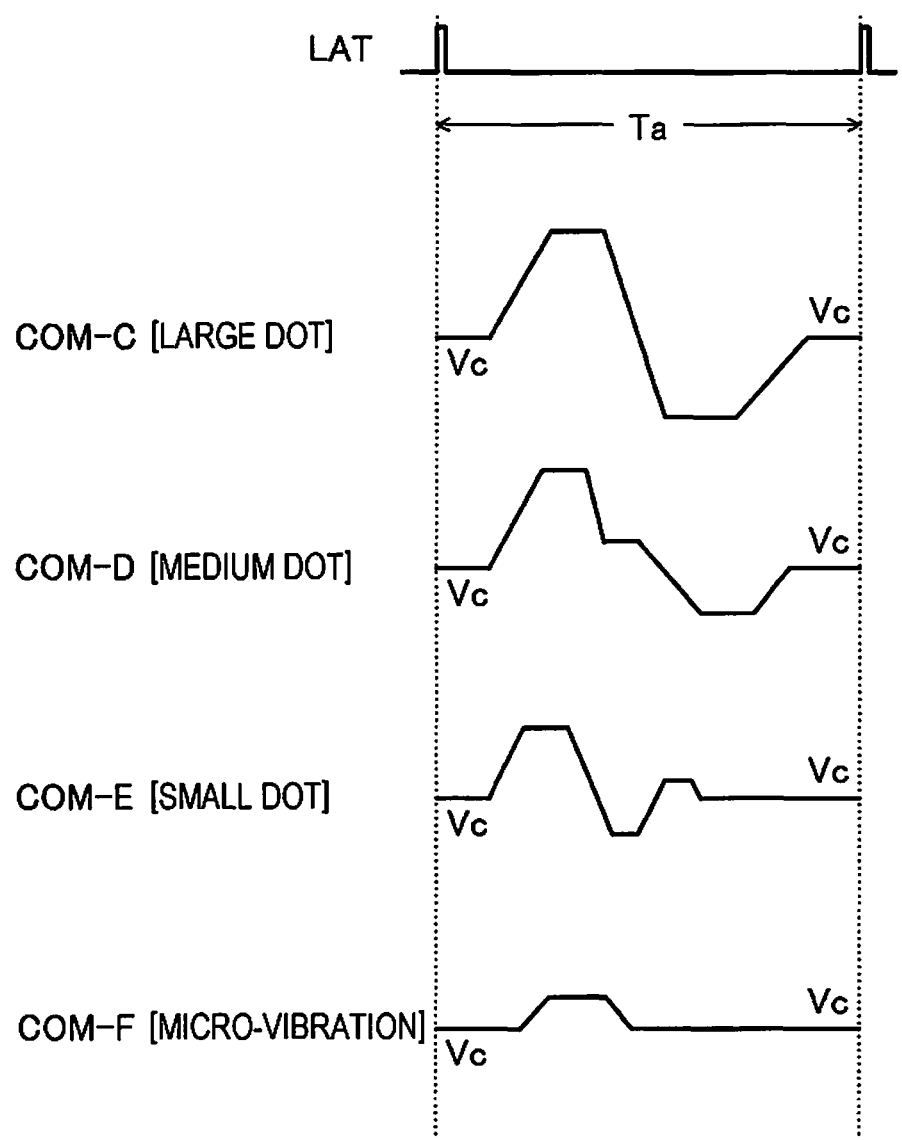
FIG. 5 shows another example of a plurality of driving signals COM.

A procedure of the driving IC 62 generating driving signals Vout by using waveforms of four driving signals COM-C, COM-D, COM-E, and COM-F shown in FIG. 5, as another example of a plurality of driving signals COM, is described below. As shown in FIG. 5, the driving signals COM-C, COM-D, COM-E, and COM-F are signals each having a single trapezoidal waveform in a print period Ta. The driving IC 62 selects one of the driving signals COM-C, COM-D, COM-E, and COM-F based on the control signal SI in the print period Ta, and outputs the selected signal as a driving signal Vout. In the example shown in FIG. 5, the print period Ta does not have to be divided by the control signal CH, and the control signal CH does not have to be input to the driving IC 62. Hence, the control signal CH in FIG. 5 is omitted.

The driving signal COM-C is a signal that causes the nozzle N of the corresponding ejection unit 600 to eject a large amount of ink when the driving signal COM-C is applied to the one end of the piezoelectric element 37 in the print period Ta. The driving signal COM-D is a signal that causes the nozzle N of the corresponding ejection unit 600 to eject a medium amount of ink when the driving signal COM-D is applied to the one end of the piezoelectric element 37 in the print period Ta. The driving signal COM-E is a signal that causes the nozzle N of the corresponding ejection unit 600 to eject a small amount of ink when the driving signal COM-E is applied to the one end of the piezoelectric element 37 in the print period Ta. The driving signal COM-F is a signal that causes ink near the opening of the nozzle N to micro-vibrate and hence prevents an increase in viscosity of the ink. Even when the driving signal COM-F is applied to the one end of the piezoelectric element 37, the nozzle N of the corresponding ejection unit 600 does not eject an ink droplet.

For example, when the control signal SI is a signal indicating "a large dot," the driving IC 62 selects and outputs the driving signal COM-C as a driving signal Vout. In this case, the ejection unit 600 including the piezoelectric element 37 to which the driving signal Vout is applied ejects ink for forming a large dot.

When the control signal SI is a signal indicating "a medium dot," the driving IC 62 selects and outputs the driving signal COM-D as a driving signal Vout. In this case, the ejection unit 600 including the piezoelectric element 37 to which the driving signal Vout is applied ejects ink for forming a medium dot.

When the control signal SI is a signal indicating "a small dot," the driving IC 62 selects and outputs the driving signal COM-E as a driving signal Vout. In this case, the ejection unit 600 including the piezoelectric element 37 to which the driving signal Vout is applied ejects ink for forming a small dot.

When the control signal SI is a signal indicating "microvibration," the driving IC 62 selects and outputs the driving signal COM-F as a driving signal Vout. In this case, the ejection unit 600 including the piezoelectric element 37 to which the driving signal Vout is applied is driven by a certain degree not ejecting ink.

When the plurality of driving signals COM are configured as shown in FIG. 5, the print period Ta for forming dots on the medium 12 can be decreased, and the print speed can be further increased.

The voltages at start timing and the voltages at end timing of the trapezoidal waveforms Adp1, Adp2, Bdp1, and Bdp2, and the driving signals COM-C, COM-D, COM-E, and COM-F are common to one another, in particular, a voltage Vc. That is, the plurality of driving signals COM are configured of waveforms started with the voltage Vc, and ended with the voltage Vc.

The driving signals COM-A and COM-B shown in FIG. 4, and the driving signals COM-C, COM-D, COM-E, and COM-F shown in FIG. 5 are merely examples, and are not limited thereto.

Referring back to FIGS. 2 and 3, the casing 40 is a case that stores ink to be supplied to the number 2M of pressure chambers C. A surface FB of the casing 40, which is a surface on the medium 12 side when viewed from the print head 26, is, for example, fixed to the surface FA of the channel substrate 32 by using an adhesive. The surface FB of the casing 40 has a recess 42 having a groove shape extending in the Y-axis direction. The protection member 38 and the driving IC 62 are housed in the recess 42. The wiring member 64 extends in the Y-axis direction to pass through the inside of the recess 42.

The casing 40 is formed by, for example, injection molding a resin material. As shown in FIG. 3, the casing 40 has a channel RB that communicates with the channel RA. The channel RA and the channel RB function as a reservoir Q that stores ink to be supplied to the number 2M of pressure chambers C.

Two inlets 43 through which ink supplied from the liquid container 14 is introduced to the reservoir Q are provided in a surface F2 of the casing 40 opposite to the surface FB. The ink supplied from the liquid container 14 to the two inlets 43 flows into the channel RA via the channel RB. The ink flowing into the channel RA is partly supplied to the pressure chamber C corresponding to the nozzle N via the channel 326 and the channel 322. The ink filled in the pressure chamber C corresponding to the nozzle N is ejected from the nozzle N via the channel 324 by the driving of the piezoelectric element 37 corresponding to the nozzle N.

3. CONFIGURATION OF ELECTRONIC DEVICE

Figure 6:
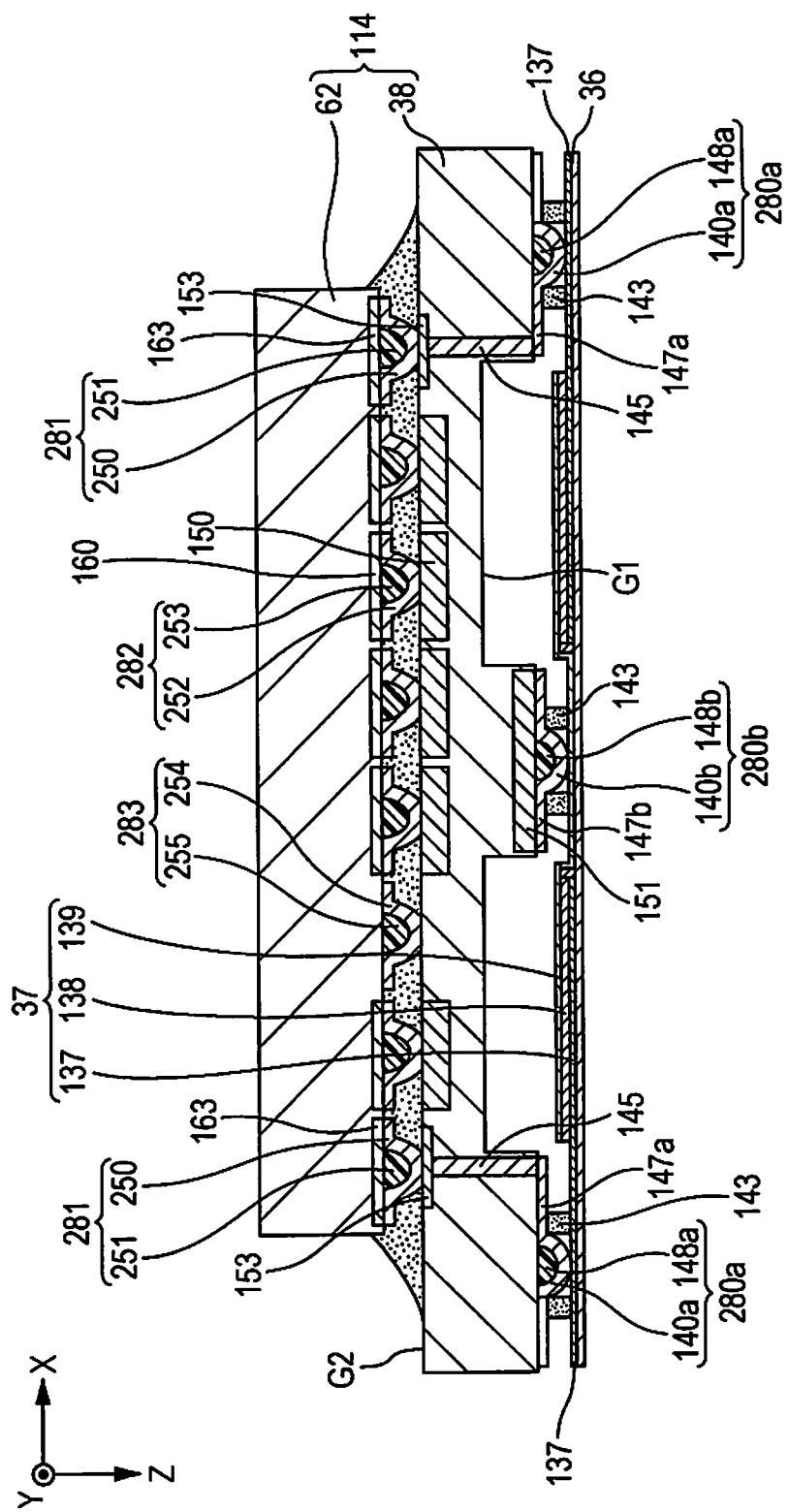
FIG. 6 shows a configuration of an electronic device.

The details of electric coupling among the driving IC 62, the protection member 38, and the piezoelectric elements 37 are described with reference to FIG. 6. FIG. 6 shows an electronic device 114 in which the driving IC 62 is stacked on the protection member 38 in the Z-axis direction thereby defining a unit, the piezoelectric element 37 electrically coupled to the electronic device 114, and the vibration portion 36 that vibrates based on the driving of the piezoelectric element 37.

The vibration portion 36 is a plate-shaped member that can vibrate as described above. The two parallel rows of the piezoelectric element 37 are arranged to extend in the Y-axis direction on the upper surface of the vibration portion 36.

Each of the piezoelectric elements 37 is configured such that a lower electrode layer 137, a piezoelectric layer 138, and an upper electrode layer 139 are stacked in that order on or above the vibration portion 36. When an electric field corresponding to a potential difference is applied between the lower electrode layer 137 and the upper electrode layer 139 of the thus configured piezoelectric element 37, the piezoelectric element 37 is displaced because of the piezoelectric effect, and the vibration portion 36 is deformed in the Z-axis direction based on the displacement of the piezoelectric element 37.

In FIG. 6, the lower electrode layer 137 is described as an individual electrode of each of the piezoelectric elements 37, and the upper electrode layer 139 is described as a common electrode common to the plurality of piezoelectric elements 37. Alternatively, the lower electrode layer 137 may be a common electrode, and the upper electrode layer 139 may be an individual electrode.

A plurality of electrodes 140a that apply the driving signals Vout output from the driving IC 62 to the piezoelectric elements 37 are formed on the surface G1 of the protection member 38. The electrodes 140a are at least partly provided on surfaces of elastic resin portions 148a that are provided on the surface G1 of the protection member 38 to protrude in the Y-axis direction. The resin portions 148a and the electrodes 140a formed on the resin portions 148a function as bump electrodes 280a (resin core bumps). The plurality of bump electrodes 280a are formed in the Y-axis direction at positions corresponding to the lower electrode layer 137 of one of the parallel arranged piezoelectric elements 37, and at positions corresponding to the lower electrode layer 137 of the other one of the parallel arranged piezoelectric elements 37. Thus, the bump electrodes 280a are electrically coupled to the lower electrode layers 137. Each electrode 140a extends from the resin portion 148a toward one of the piezoelectric element 37 side and the side opposite to the piezoelectric element 37 side, and forms wiring 147a. An end of the wiring 147a opposite to the electrode 140a is coupled to through wiring 145.

In addition, a plurality of electrodes 140b that output the constant voltage signal VBS to the piezoelectric elements 37 are formed on the surface G1 of the protection member 38. The electrodes 140b are at least partly provided on surfaces of elastic resin portions 148b that are provided on the surface G1 of the protection member 38 to protrude in the Y-axis direction. The resin portions 148b and the electrodes 140b formed on the resin portions 148b function as bump electrodes 280b. The plurality of bump electrodes 280b are formed in the Y-axis direction at positions corresponding to the upper electrode layer 139 that is common to the two rows of parallel arranged piezoelectric elements 37. Thus, the bump electrodes 280b are electrically coupled to the upper electrode layer 139. Each electrode 140b protrudes from the resin portion 148b toward both sides in the width direction of the resin portion 148b, forms wiring 147b, and is electrically continuous to buried wiring 151.

The protection member 38 is joined to the vibration portion 36 by using a photosensitive adhesive 143 with the bump electrodes 280a and 280b interposed. The photosensitive adhesive 143 is formed on both sides of each of the bump electrodes 280a and 280b in the X-axis direction. Each photosensitive adhesive 143 may be formed in a strip shape extending in the nozzle-row direction in a state separated from the bump electrodes 280a and 280b.

A plurality of buried wiring 150 extending in the Y-axis direction are formed in the surface G2 of the protection member 38. A plurality of signals including the plurality of driving signals COM, and control signals such as the control signal SI are supplied to the buried wiring 150 from the wiring member 64 (see FIG. 2) via the wiring 388 (see FIG. 2).

Furthermore, a plurality of electrodes 153 are formed in the Y-axis direction in the surface G2 of the protection member 38, in regions on the outer sides in the X-axis direction of the region where the buried wiring 150 are formed. Each electrode 153 is coupled to the corresponding wiring 147a via the wiring 384 (see FIG. 2) and the through wiring 145. The through wiring 145 is wiring for relay between the surface G1 and the surface G2 of the protection member 38. Thus, the electrode 153 is electrically coupled to the electrode 140a via the wiring 147a and the through wiring 145.

A plurality of electrodes 250 are formed on a surface of the driving IC 62 opposing the protection member 38, in regions opposing the electrodes 153. The electrodes 250 are at least partly provided on surfaces of elastic resin portions 251. The resin portions 251 are provided on the surface of the driving IC 62 opposing the protection member 38, to protrude in the Y-axis direction. The resin portions 251 and the electrodes 250 formed on the resin portions 251 function as bump electrodes 281 (an example of "energization bumps").

In addition, electrodes 163 that are electrically coupled to the electrodes 250 are provided in regions of the driving IC 62 where the bump electrodes 281 are formed. The electrodes 163 output the driving signals Vout generated by the driving IC 62. When the driving signals Vout are input to the electrodes 153 via the bump electrodes 281, the driving signals Vout are applied to the piezoelectric elements 37 (the lower electrode layers 137). Hence, a circuit element and wiring for generating the driving signal Vout are provided near the electrodes 163 of the driving IC 62. That is, the bump electrodes 281 are arranged at positions so as to overlap at least one of the circuit element and the wiring formed on the driving IC 62 when viewed in the Z-axis direction (hereinafter, referred to as a plan view), and are arranged at positions so as to overlap at least one of a circuit element and wiring formed on the protection member 38.

A plurality of electrodes 252 are formed on the surface of the driving IC 62 opposing the protection member 38, in regions opposing the buried wiring 150. The electrodes 252 are at least partly provided on surfaces of elastic resin portions 253. The resin portions 253 are provided on the surface of the driving IC 62 opposing the protection member 38, to protrude in the Y-axis direction. The resin portions 253 and the electrodes 252 formed on the resin portions 253 function as bump electrodes 282. The protection member 38 is electrically coupled to the driving IC 62 by the bump electrodes 282.

Electrodes 160 that are electrically coupled to the electrodes 252 are provided in regions of the driving IC 62 where the bump electrodes 282 are formed. The plurality of driving signals COM, and control signals such as the control signal SI are supplied to the electrodes 160 from the buried wiring 150 via the bump electrodes 282. A circuit element and wiring for control based on various input signals are provided near the electrodes 160 of the driving IC 62. That is, the bump electrodes 282 are arranged at positions so as to overlap at least one of the circuit element and the wiring formed on the driving IC 62 in a plan view, and are arranged at positions so as to overlap at least one of the circuit element and the wiring formed on the protection member 38.

An electrode 254 is formed on the surface of the driving IC 62 opposing the protection member 38, in a region not opposing the buried wiring 150 and the electrodes 153. The electrode 254 is at least partly provided on a surface of an elastic resin portion 255. The resin portion 255 is provided on the surface of the driving IC 62 opposing the protection member 38, in a protruding manner. The resin portion 255 and the electrode 254 formed on the resin portion 255 function as a bump electrode 283 (an example of "inspection bump").

An electrode, a circuit element, and wiring are not formed in the region of the driving IC 62 where the bump electrode 283 is formed. The bump electrode 283 provides physical coupling between the driving IC 62 and the protection member 38; however, does not provide electric coupling therebetween. That is, the bump electrode 283 is arranged at a position so as not to overlap the circuit element and the wiring formed on the driving IC 62 in a plan view, and is arranged at a position so as not to overlap the circuit element and the wiring formed on the protection member 38 in a plan view.

4. CHECK OF COUPLING STATE OF BUMP ELECTRODE OF ELECTRONIC DEVICE

With the electronic device 114 in which the driving IC 62 is stacked on the protection member 38, to decrease the defect rate (to increase the yield), it is demanded to accurately electrically couple the electrodes 160 and the electrodes 163 provided on the driving IC 62 to the buried wiring 150 and the electrodes 153 arranged in the protection member 38 via the bump electrodes 281 and the bump electrodes 282. Owing to this, it is desirable to perform inspection whether all the electrodes are electrically coupled (hereinafter, referred to as continuity inspection). The driving IC 62 and the protection member 38 are provided with the electrodes 163 and the electrodes 153 by the number corresponding to the number of nozzles N arranged at the print head 26 (in this embodiment, for example, the print head 26 has the two nozzle rows each having the ejection units 600 with the density of 300 nozzles per inch as shown in FIG. 2, and in a case where the length is 1 inch, 600 nozzles are provided). Furthermore, since a plurality of signals, such as the plurality of driving signals COM and the control signals, corresponding to the respective nozzles N of the nozzle rows are input to the driving IC 62 and the protection member 38, the electrodes 160 and the buried wiring 150 that transfer the signals are required by a number several times the number of nozzles N. In other words, in the print head 26, the number of the bump electrodes 281 and 282 that electrically couple the electrodes 160 and the electrodes 163 of the driving IC 62 to the buried wiring 150 and the electrodes 153 of the protection member 38 is several thousands. Hence, if the continuity inspection between the driving IC 62 and the protection member 38 is performed for all the electrically coupled bump electrodes 281 and 282, a long inspection time is required.

Therefore, in this embodiment, the bump electrode 283 for inspection that does not input an electric signal to the electronic device 114 is provided, infrared rays IR are emitted on the electronic device 114 including the bump electrode 283, the coupling state between the driving IC 62 and the protection member 38 by the bump electrode 283 is representatively detected, and thus the continuity inspection between the driving IC 62 and the protection member 38 is performed.

Figure 7:
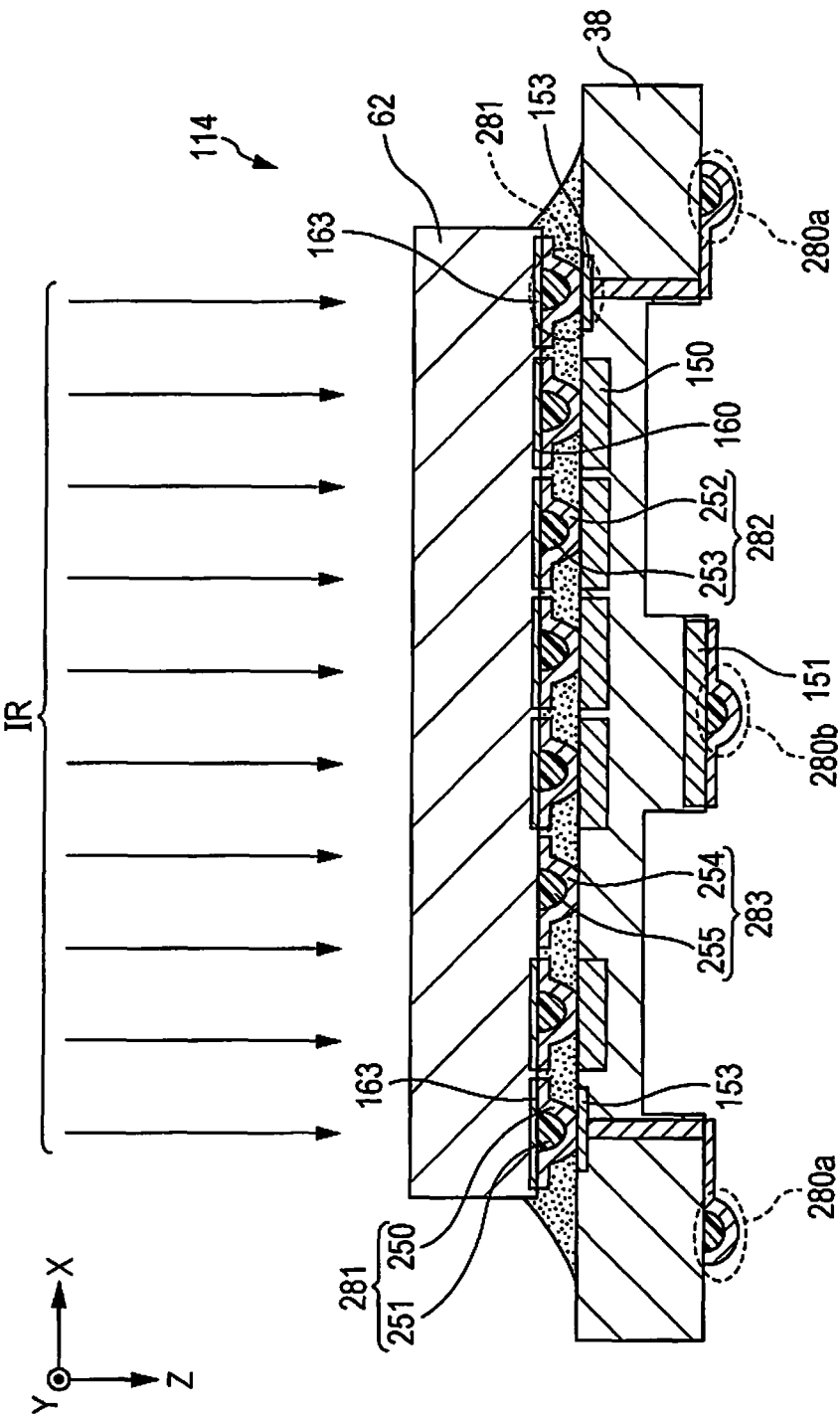
FIG. 7 shows a direction in which infrared rays are emitted on the electronic device.
Figure 8:
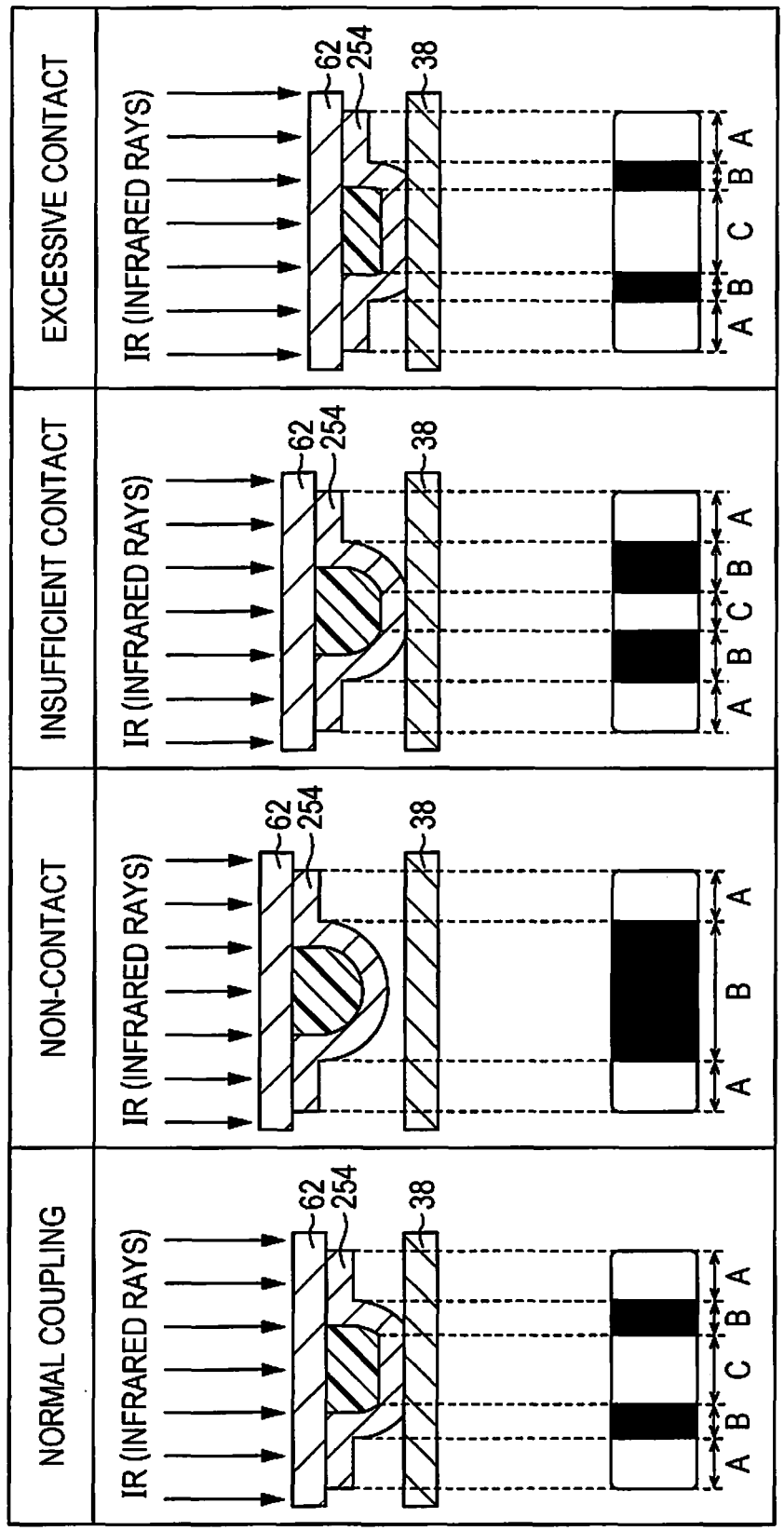
FIG. 8 shows an example of a judgment criteria for continuity inspection between a driving IC and a protection member.

FIGS. 7 and 8 are illustrations for explaining an example method of the continuity inspection between the driving IC 62 and the protection member 38. FIG. 7 shows a direction in which infrared rays IR are emitted on the electronic device 114. As shown in FIG. 7, the infrared rays IR are emitted on the electronic device 114 from the driving IC 62 side toward the protection member 38 in the Z-axis direction. In this case, the infrared rays IR emitted on the electronic device 114 are light with wavelengths transmitted through a silicon substrate or the like that configures the driving IC 62. For example, the infrared rays IR are desirably light having wavelengths of 1100 nm 10%. Furthermore, the infrared rays IR are desirably light having wavelengths such that the transmittance of the region of the driving IC 62 where the circuit element and the wiring are not formed is higher than the transmittance of the region of the driving IC 62 where at least one of the circuit element and the wiring is formed. The light used for the continuity inspection may be light that is transmitted through the silicon substrate which is a base member of the driving IC 62. For example, the continuity inspection may be performed using light in a short wavelength range, such as X-rays.

The infrared rays IR emitted on the electronic device 114 is transmitted through the silicon substrate of the driving IC 62, and is emitted on the bump electrode 283. The infrared rays IR emitted on the bump electrode 283 are transmitted through (or reflected from) the electrode 254 included in the bump electrode 283. In this embodiment, a detector (not shown) detects the light transmitted through (or reflected from) the electrode 254, and hence detects the coupling state between the driving IC 62 and the protection member 38 by the bump electrode 283. Thus the continuity inspection is performed between the driving IC 62 and the protection member 38. When the continuity inspection is performed based on the transmitted light of the infrared rays IR emitted on the driving IC 62, the detector is desirably provided below the protection member 38 of the stacked electronic device 114. When the continuity inspection is performed based on the reflected light of the infrared rays IR emitted on the driving IC 62, the detector is desirably provided above the driving IC 62 of the stacked electronic device 114. In this case, the description is given below while the light detected by the detector through the continuity inspection is referred to as detected light.

FIG. 8 shows an example of a judgment criteria for the continuity inspection among the bump electrode 283 (the electrode 254), the driving IC 62, and the protection member 38. The upper section of FIG. 8 shows an example of the coupling state among the driving IC 62 and the protection member 38, and the electrode 254 interposed therebetween. The lower section of FIG. 8 shows an example of detected light when the infrared rays IR are emitted. Furthermore, FIG. 8 shows, as examples of detected light, a state in which the bump electrode 283 is coupled to the protection member 38 normally (hereinafter, normal coupling state), a state in which the bump electrode 283 does not contact the protection member 38 (hereinafter, non-contact state), a state in which the bump electrode 283 weakly contacts the protection member 38 (hereinafter, insufficient contact state), and a state in which the bump electrode 283 strongly contacts the protection member 38 (hereinafter, excessive contact state).

A portion A in the lower section of FIG. 8 indicates detected light when the infrared rays IR are emitted on the region where the electrode 254 contacts the driving IC 62. Since the electrode 254 surface contacts the driving IC 62, the infrared rays IR emitted on the portion A are transmitted through (or regularly reflected from, the same applies hereinafter) the electrode 254. Thus, the detected light of the region indicated by the portion A is determined by the light amount of the emitted infrared rays IR and the transmittance (or reflectance, the same applies hereinafter) of the electrode 254.

A portion B indicates detected light when the infrared rays IR are emitted on a curved portion of the electrode 254. The infrared rays IR emitted on the curved portion of the electrode 254 are reflected at a reflection angle corresponding to the angle of the curved portion. Thus, the detected light of the region indicated by the portion B has a smaller value than the light amount determined by the light amount of the emitted infrared rays IR and the transmittance of the electrode 254.

A portion C indicates detected light when the infrared rays IR are emitted on the region where the electrode 254 contacts the protection member 38. The electrode 254 is the bump electrode 283 in which the electrode 254 is provided on the surface of the elastic resin portion 255. In the region where the electrode 254 contacts the protection member 38, the resin portion 255 is deformed and makes surface contact. The infrared rays IR emitted on the portion C are transmitted through the electrode 254. Thus, the detected light of the region indicated by the portion C is determined by the light amount of the emitted infrared rays IR and the transmittance of the electrode 254.

In this way, using the detected light detected based on the infrared rays IR emitted from the electrode 254, the three regions of the portion A, portion B, and portion C corresponding to the contact state between the bump electrode 283 and the protection member 38 are obtained, and the areas of the detected regions vary depending on the contact state.

Specifically, when the bump electrode 283 does not contact the protection member 38 as shown in FIG. 8, the electrode 254 does not contact the protection member 38, and the region indicated by the portion C is not detected. When the bump electrode 283 and the protection member 38 are in the insufficient contact state, the region of the portion B indicating the curved portion of the electrode 254 is larger than that of the normal coupling state, and the region of the portion C indicating the contact between the electrode 254 and the protection member 38 is smaller than that of the normal coupling state. When the bump electrode 283 and the protection member 38 are in the excessive contact state, the region of the portion B indicating the curved portion of the electrode 254 is smaller than that of the normal coupling state, and the region of the portion C indicating the contact between the electrode 254 and the protection member 38 is larger than that of the normal coupling state.

In this way, by emitting the infrared rays IR on the electronic device 114, the contact state between the bump electrode 283 and the protection member 38 can be easily recognized.

The bump electrodes 281 and 282 that electrically couple the driving IC 62 and the protection member 38 to each other, and the bump electrode 283 for inspection are formed of resin core bumps. Hence, the bumps can be formed by the same manufacturing method, and variations in size, such as a difference in height, can be reduced. That is, the bump electrodes 281, 282, and 283 can be formed as resin core bumps having equivalent sizes. Thus, the contact state between the bump electrode 283 and the protection member 38 correlates with the contact state of the bump electrodes 281 and 282 that electrically couple the driving IC 62 and the protection member 38 to each other. That is, by detecting the coupling state between the driving IC 62 and the protection member 38 by using the detected light based on the infrared rays IR emitted on the bump electrode 283 for inspection (the electrode 254), the continuity inspection between the driving IC 62 and the protection member 38 which are electrically coupled to each other by the bump electrodes 281 and 282 can be performed, and the time required for the continuity inspection can be reduced.

The resin portions 251, 253, and 255 that form the bump electrodes 281, 282, and 283 are desirably formed on a surface of the driving IC 62 on the side coupled to the protection member 38. In other words, the bump electrodes 281, 282, and 283 are desirably formed on a surface of the driving IC 62 on the side coupled to the protection member 38. Since the resin portions 251, 253, and 255 are formed on the driving IC 62, the positions of the bump electrodes 281, 282, and 283 are specified on at least one of the driving IC 62 and the protection member 38. Thus, the coupling positions with respect to the driving IC 62 and the protection member 38 can be easily determined in the electronic device 114.

On the driving IC 62, the wiring for transferring signals such as the plurality of driving signals COM, and the circuit element that performs operations based on the signals are formed. The wiring and the circuit element each are typically formed by implanting ions in a silicon substrate or the like being a base member, and forming a P-type doped region or an N-type doped region. In the region with ions implanted (hereinafter, doped region), the ions change the transmittance of the base member such as the silicon substrate. Therefore, the bump electrode 283 is desirably provided in the region of the driving IC 62 where the circuit element and the wiring are not arranged, and more particularly, the region is desirably a non-doped region. The non-doped region is a region of the silicon substrate where P-type doping ions or N-type doping ions are not implanted (or a region where a very small amount of ions are actually implanted; however, the state is apparently equivalent to the state without the ions implanted.

5. LAYOUT OF BUMP ELECTRODES OF DRIVING IC

The arrangement of the bump electrodes 281 and 282 for energization and the bump electrode 283 for inspection arranged on the driving IC 62 is described below with reference to FIGS. 9 and 10.

Figure 9:
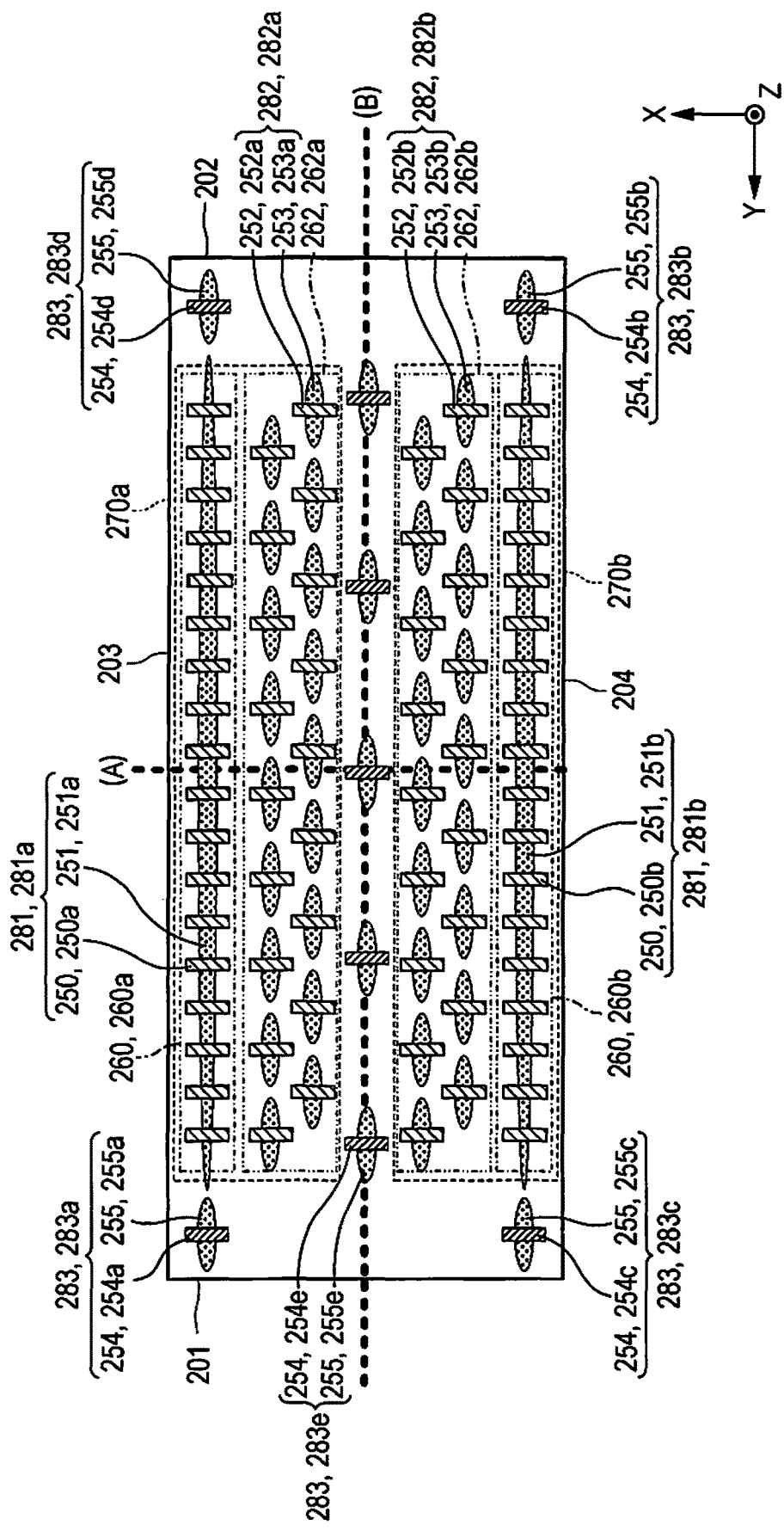
FIG. 9 shows a bump formation surface of the driving IC.
Figure 10:
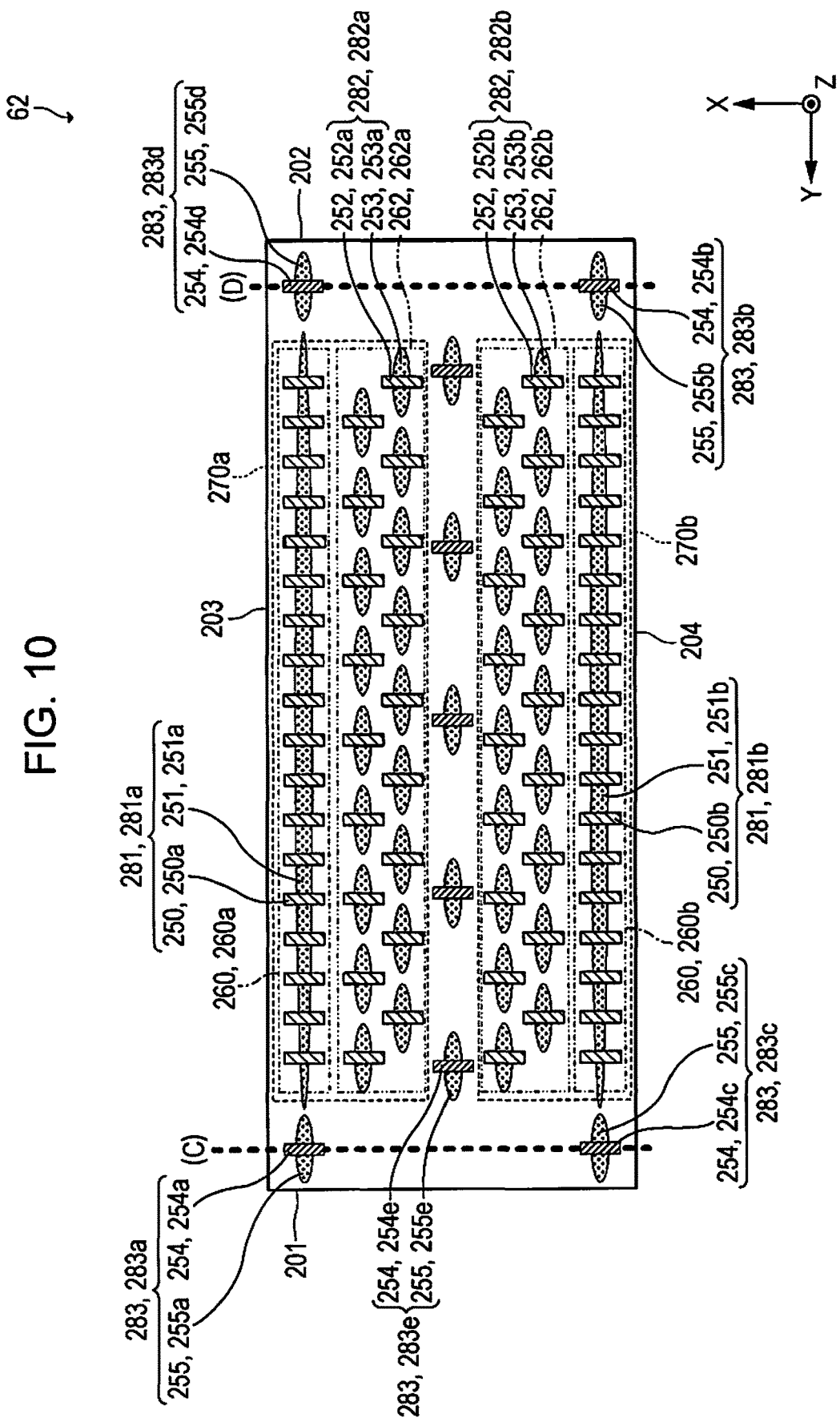
FIG. 10 shows the bump formation surface of the driving IC.

FIGS. 9 and 10 show the surface of the driving IC 62 on which the bump electrodes 281, 282, and 283 are formed (hereinafter, referred to as bump formation surface). The driving IC 62 has a rectangular shape defined by a short side 201 (an example of "first short side"), a short side 202 (an example of "second short side") opposite to the short side 201, a long side 203 (an example of "first long side"), and a long side 204 (an example of "second long side") opposite to the long side 203. The driving IC 62 may be a long IC such that the long side 203 has a length that is 10 times or more the length of the short side 201.

Some electrodes 250a of the plurality of electrodes 250 are provided on a surface of a resin portion 251a extending along the long side 203 in the Y-axis direction from the short side 201 toward the short side 202 of the driving IC 62, and thus form a plurality of bump electrodes 281 (bump electrodes 281a). In other words, the plurality of bump electrodes 281a are lined along the long side 203 in the Y-axis direction from the short side 201 toward the short side 202 of the driving IC 62. The plurality of bump electrodes 281a configure a bump electrode group 260a. The plurality of bump electrodes 281a included in the bump electrode group 260a are located between the driving IC 62 and the protection member 38, and physically and electrically couple the driving IC 62 and the protection member 38 to each other. Thus, the driving signal Vout output from the driving IC 62 is transmitted to the protection member 38 through each of the plurality of bump electrodes 281a, and for example, drives the piezoelectric elements 37 provided for the number M of nozzles N1 belonging to the row L1 in FIG. 2.

Some electrodes 252a of the plurality of electrodes 252 are provided on surfaces of resin portions 253a arranged along the bump electrode group 260a in the Y-axis direction from the short side 201 toward the short side 202 of the driving IC 62, and thus form a plurality of bump electrodes 282 (bump electrodes 282a). In other words, the plurality of bump electrodes 282a are arranged on the side near the long side 204 of the bump electrode group 260a of the driving IC 62. The plurality of bump electrodes 282a configure a bump electrode group 262a. The plurality of bump electrodes 282a included in the bump electrode group 262a are located between the driving IC 62 and the protection member 38, and physically and electrically couple the driving IC 62 and the protection member 38 to each other. Thus, a plurality of input signals, such as the plurality of driving signals COM and the control signals, are input to the driving IC 62 via the bump electrode group 262a. In FIGS. 9 and 10, the bump electrodes 282a are arranged in two rows extending in the Y-axis direction from the short side 201 toward the short side 202 in the bump electrode group 262a. Alternatively, the bump electrodes 282a may be arranged in a single row, or three or more rows.

In this case, at least one of wiring to which signals and the like for controlling the driving of the piezoelectric elements 37, such as the plurality of driving signals COM, the control signal LAT, and the control signal CH, are input from the bump electrode group 262a; a circuit that generates a driving signal Vout that is output from the bump electrode group 260a based on the plurality of signals; transfer wiring; and a circuit element that configures the above-listed components is arranged in a region 270a of the driving IC 62 where the bump electrode group 260a and the bump electrode group 262a are arranged.

Some electrodes 250b of the plurality of electrodes 250 are provided on a surface of a resin portion 251b extending along the long side 204 in the Y-axis direction from the short side 201 toward the short side 202 of the driving IC 62, and thus form a plurality of bump electrodes 281 (bump electrodes 281b). In other words, the plurality of bump electrodes 281b are lined along the long side 204 in the Y-axis direction from the short side 201 toward the short side 202 of the driving IC 62. The plurality of bump electrodes 281b configure a bump electrode group 260b. The plurality of bump electrodes 281b included in the bump electrode group 260b are located between the driving IC 62 and the protection member 38, and physically and electrically couple the driving IC 62 and the protection member 38 to each other. Thus, the driving signal Vout output from the driving IC 62 is transmitted to the protection member 38 through each of the plurality of bump electrodes 281b, and for example, drives the piezoelectric element 37 provided for the number M of nozzles N2 belonging to the row L2 in FIG. 2.

Some electrodes 252b of the plurality of electrodes 252 are provided on surfaces of resin portions 253b arranged along the bump electrode group 260b in the Y-axis direction from the short side 201 toward the short side 202 of the driving IC 62, and thus form a plurality of bump electrodes 282 (bump electrodes 282b). In other words, the plurality of bump electrodes 282b are arranged on the side near the long side 203 of the bump electrode group 260b of the driving IC 62. The plurality of bump electrodes 282b configure a bump electrode group 262b. The plurality of bump electrodes 282b included in the bump electrode group 262b are located between the driving IC 62 and the protection member 38, and physically and electrically couple the driving IC 62 and the protection member 38 to each other. Thus, a plurality of input signals, such as the plurality of driving signals COM and the control signals, are input to the driving IC 62 via the bump electrode group 262b. In FIGS. 9 and 10, the bump electrodes 282b are arranged in two rows extending in the Y-axis direction from the short side 201 toward the short side 202 in the bump electrode group 262b. Alternatively, the bump electrodes 282b may be arranged in a single row, or three or more rows.

In this case, at least one of wiring to which signals and the like for controlling the driving of the piezoelectric elements 37, such as the plurality of driving signals COM, the control signal LAT, and the control signal CH, are input from the bump electrode group 262*b*; a circuit that generates a driving signal Vout that is output from the bump electrode group 260*b* based on the plurality of signals; transfer wiring; and a circuit element that configures the above-listed components is arranged in a region 270*b* of the driving IC 62 where the bump electrode group 260*b* and the bump electrode group 262*b* are arranged.

Moreover, in this embodiment, a plurality of bump electrodes 283 are provided on the bump formation surface. The bump electrodes 283 provide physical coupling, but do not provide electric coupling between the protection member 38 and the driving IC 62.

A bump electrode 283*a* (an example of "first bump") which is one of the bump electrodes 283 is configured of a resin portion 255*a* and an electrode 254*a* arranged on a surface of the resin portion 255*a*, in a region between the short side 201 and an imaginary line A (an example of "first line") that connects the midpoint of the long side 203 and the midpoint of the long side 204 of the driving IC 62 in a plan view. The region is a non-doped region where wiring and a circuit element are not formed. More preferably, the bump electrode 283*a* is desirably arranged in a region between the long side 203 and an imaginary line B (an example of "fourth line") that connects the midpoint of the short side 201 and the midpoint of the short side 202 in a plan view of the driving IC 62. Further preferably, the bump electrode 283*a* does not overlap the imaginary line A and the imaginary line B, and is arranged along the short side 201 in the region.

A bump electrode 283*b* (an example of "second bump") which is one of the bump electrodes 283 is configured of a resin portion 255*b* and an electrode 254*b* arranged on a surface of the resin portion 255*b*, in a region between the imaginary line A and the short side 202 of the driving IC 62 in a plan view. The region is a non-doped region where wiring and a circuit element are not formed. More preferably, the bump electrode 283*b* is arranged in a region between the imaginary line B and the long side 204 in a plan view of the driving IC 62. Further preferably, the bump electrode 283*b* does not overlap the imaginary line A and the imaginary line B, and is arranged along the short side 201 in the region.

In this way, the bump electrodes 283*a* and 283*b* are not axially symmetrical to each other about the imaginary line A and the imaginary line B. In other words, the line that connects the bump electrodes 283*a* and 283*b* is non-orthogonal to the imaginary line A in a plan view. By performing the continuity inspection based on the detection result of the coupling state between the driving IC 62 and the protection member 38 by the bump electrodes 283*a* and 283*b* thus arranged, a shift of the coupling position occurring between the driving IC 62 and the protection member 38 can be accurately detected. Moreover, since the bump electrodes 283*a* and 283*b* are arranged asymmetrically, even when at least one side of the driving IC 62 rises from the protection member 38 due to insufficient coupling, the rise can be accurately detected. Thus, the accuracy of the continuity inspection based on the detection result of the bump electrodes 283*a* and 283*b* can be further increased.

Furthermore, a bump electrode 283*c* (an example of "fourth bump") which is one of the bump electrodes 283 is configured of a resin portion 255*c* and an electrode 254*c* arranged on a surface of the resin portion 255*c* on the bump formation surface of the driving IC 62, in a region between the imaginary line A and the short side 201 and a region between the imaginary line B and the long side 204 of the driving IC 62 in a plan view. The region is a non-doped region where wiring and a circuit element are not formed. Preferably, the bump electrode 283*c* does not overlap the imaginary line A and the imaginary line B, and is arranged along the short side 201 in the region.

Furthermore, a bump electrode 283*d* (an example of "fifth bump") which is one of the bump electrodes 283 is configured of a resin portion 255*d* and an electrode 254*d* arranged on a surface of the resin portion 255*d* on the bump formation surface of the driving IC 62, in a region between the imaginary line A and the short side 202 and a region between the imaginary line B and the long side 203 of the driving IC 62 in a plan view. The region is a non-doped region where wiring and a circuit element are not formed. Preferably, the bump electrode 283*d* does not overlap the imaginary line A and the imaginary line B, and is arranged along the short side 201 in the region.

In this way, the bump electrodes 283*c* and 283*d* are arranged on the bump formation surface of the driving IC 62, in addition to the bump electrodes 283*a* and 283*b*. By performing the continuity inspection based on the detection result of the coupling state between the driving IC 62 and the protection member 38 by the plurality of bump electrodes 283 including the above-referenced bump electrodes, a shift of the coupling position occurring between the driving IC 62 and the protection member 38 can be further accurately detected. Furthermore, since the bump electrodes 283*a*, 283*b*, 283*c*, and 283*d* are arranged in four respective regions divided by the imaginary lines A and B, when the detection result of each of the bump electrodes 283 is the normal coupling state, a twist of the driving IC 62 occurring at the coupling between the driving IC 62 and the protection member 38 can be reduced. Thus, the accuracy of the continuity inspection can be further increased.

Note that the bump electrodes 283*a*, 283*b*, 283*c*, and 283*d* are preferably arranged near four respective corners of the long rectangular driving IC 62. Specifically, the bump electrode 283*a* is preferably arranged near the corner of the driving IC 62 at which the short side 201 intersects with the long side 203, on an extension line of the bump electrode group 260*a* that is arranged along the long side 203 toward the short side 201. The bump electrode 283*b* is preferably arranged near the corner of the driving IC 62 at which the short side 202 intersects with the long side 204, on an extension line of the bump electrode group 260*b* that is arranged along the long side 204 toward the short side 202. The bump electrode 283*c* is preferably arranged near the corner of the driving IC 62 at which the short side 201 intersects with the long side 204, on an extension line of the bump electrode group 260*b* that is arranged along the long side 204 toward the short side 201. The bump electrode 283*d* is preferably arranged near the corner of the driving IC 62 at which the short side 202 intersects with the long side 203, on an extension line of the bump electrode group 260*a* that is arranged along the long side 203 toward the short side 202. With the arrangement, even when the driving IC 62 has a long shape such that the long side 203 is 10 times or more the short side 201, the detection accuracy for a twist or a positional shift occurring at the coupling to the protection member 38 can be further increased.

A plurality of bump electrodes 283 may be arranged in the X-axis direction along the short side 201, in a region between the bump electrodes 283*a* and 283*c* in a plan view. Similarly, a plurality of bump electrodes 283 may be arranged in the X-axis direction along the short side 202, in a region between the bump electrodes 283b and 283d in a plan view.

In addition, a bump electrode 283e (an example of "third bump") which is one of the bump electrodes 283 is provided on the bump formation surface of the driving IC 62. As shown in FIGS. 9 and 10, the bump electrode 283e is configured of a resin portion 255e and an electrode 254e arranged on a surface of the resin portion 255e, in a region between an imaginary line C (an example of "second line") that passes through at least a portion of the bump electrode 283a and is parallel to the short side 201 and an imaginary line D (an example of "third line") that passes through at least a portion of the bump electrode 283b and is parallel to the short side 202 of the driving IC 62 in a plan view. The region is a non-doped region where wiring and a circuit element are not formed.

When the driving IC 62 has a long shape, the driving IC 62 is coupled to the protection member 38 possibly in a curved state in the longitudinal direction. By arranging the bump electrode 283e between the bump electrodes 283a and 283b, a phenomenon in which the driving IC 62 is curved with respect to the protection member 38 and rises from the protection member 38 due to the curve can be detected. Thus, even with the driving IC 62 and the protection member 38 with long shapes, the continuity inspection can be accurately performed. In this case, a plurality of bump electrodes 283e are preferably provided in the region as shown in FIGS. 9 and 10. By detecting the rise of the driving IC 62 based on the plurality of bump electrodes 283e, the detection accuracy for the coupling position and the rise of the driving IC 62 with respect to the protection member 38 can be further increased, and the coupling between the protection member 38 and the driving IC 62 can be performed by substantially uniform force. A stress that is applied to the driving IC 62 after the coupling can be reduced.

In FIGS. 9 and 10, the plurality of bump electrodes 283e are five bump electrodes 283e lined along the long side 203 from the short side 201 toward the short side 202. However, the number of the bump electrodes 283e may be four or less, or six or more in accordance with the length in the long-side direction of the driving IC 62, the density with which the bump electrodes 281 and 282 are arranged, and the positions at which the wiring and the circuit element are arranged on the driving IC 62.

As described above, on the driving IC 62 of this embodiment, the bump electrodes 281 that each output the driving signal Vout from the driving IC 62 to the protection member 38; the bump electrodes 282 that each receive signals such as the plurality of driving signals COM via the protection member 38; and the bump electrodes 283 that each do not receive the electric signals or do not output the electric signals are arranged as described above. By configuring the bump electrodes 283 as described above, the detection accuracy for the coupling state between the driving IC 62 and the protection member 38 can be increased, the accuracy of the continuity inspection that is performed based on the detection result can be increased, and the inspection time can be reduced.

6. ADVANTAGES

The bump electrodes 281 and 282 that are located between the driving IC 62 and the protection member 38 and that physically and electrically couple the driving IC 62 and the protection member 38 to each other; and the bump electrode 283 that is located between the driving IC 62 and the protection member 38 and that physically couples but does not electrically couples the driving IC 62 and the protection member 38 to each other are provided. The bump electrode 283 is arranged at a position so as not to overlap the circuit element and the wiring of the driving IC 62 in a plan view. When the coupling between the driving IC 62 and the protection member 38 is inspected by emitting light having wavelengths that are transmitted through the driving IC 62 on the driving IC 62, since a circuit element and wiring forming the driving IC 62 are not arranged in the region of the driving IC 62 corresponding to the position at which the bump electrode 283 is arranged, a phenomenon in which the emitted light is reflected and attenuated by the circuit element and the wiring can be reduced, and the light can be efficiently emitted on the bump electrode 283. Therefore, the coupling state among the bump electrode 283, the protection member 38, and the driving IC 62 can be accurately recognized.

In this case, the bump electrodes 281 and 282 that electrically couple the driving IC 62 and the protection member 38 to each other, and the bump electrode 283 are resin core bumps having similar configurations. Thus, variations in manufacturing, such as variations in size, of the bump electrodes 281, 282, and 283 can be reduced. Accordingly, the electric coupling state between the driving IC 62 and the protection member 38 by the bump electrodes 281 and 282 can be determined based on the coupling state between the driving IC 62 and the protection member 38 by the bump electrode 283. In other words, the electric coupling state between the driving IC 62 and the protection member 38 can be checked by using the bump electrode 283 as a representative. Accordingly, all the plurality of bump electrodes 281 and 282 provided on the driving IC 62 are not required to be inspected for the electric coupling state between the driving IC 62 and the protection member 38. The time required for the continuity inspection between the driving IC 62 and the protection member 38 coupled by using the plurality of resin core bumps can be reduced. Furthermore, as described above, since the coupling state among the bump electrode 283, the protection member 38, and the driving IC 62 can be accurately recognized, the inspection accuracy of the continuity inspection between the driving IC 62 and the protection member 38 coupled by using the plurality of resin core bumps can be increased.

Moreover, with the print head 26 according to this embodiment, the bump electrode 283 for inspection includes the bump electrodes 283a, 283b, 283c, and 283d; the bump electrodes 283 for inspection are located near the four corners of the driving IC 62, and the plurality of bump electrodes 283e are arranged in a center portion of the driving IC 62. Accordingly, when the continuity inspection between the driving IC 62 and the protection member 38 is performed, a positional shift, a rise, and a twist of the driving IC 62 with respect to the protection member 38 can be also inspected, and the inspection accuracy of the continuity inspection can be increased.

In addition, with the print head 26 according to this embodiment, the continuity inspection of the driving IC 62 and the protection member 38 is performed using the infrared rays IR emitted on the electrode 254 for detection. Accordingly, a space to allow a probe or the like to come into contact with the print head 26 is not required, and the density of the print head 26 can be further increased.

7. MODIFICATIONS

In the above-described embodiment, the bump electrodes 283e which are of one type of the plurality of bump electrodes 283 for inspection are lined in the direction from the short side 201 toward the short side 202 between the bump electrode group 262a and the bump electrode group 262b. However, for example, the bump electrodes 283e may be lined in the direction from the short side 201 toward the short side 202 between the bump electrode group 260a and the bump electrode group 262a, and between the bump electrode group 260b and the bump electrode group 262b.

With this arrangement, the coupling between the driving IC 62 and the protection member 38 can be checked at a position near the output of the driving signal Vout at which electrodes are provided with particularly high density on the bump formation surface of the driving IC 62. Thus, the detection accuracy for the electric coupling between the driving IC 62 and the protection member 38 is further increased.

8. APPLICATION EXAMPLE

In each embodiment and each modification described above, the liquid ejecting apparatus 100 is a print dedicated machine; however, the liquid ejecting apparatus 100 may be a multifunction machine having a copy function and a scanner function.

The multifunction machine has more functions than the print dedicated machine having a single function, and it is demanded to increase the packing density of the ejection units 600 that eject ink. The print head according to the invention can be downsized and increased in the packing density as compared with a print head of related art, and hence is suitable for such demand. The multifunction machine with the invention applied can attain a greater advantage in view of the increase in the packing density and the downsizing as compared with the printer having the single function with the invention applied.

In each embodiment and each modification described above, the liquid ejecting apparatus 100 is a stationary apparatus; however, may be a portable apparatus.

The portable apparatus is more demanded to be downsized as compared with the stationary apparatus in view of portability. Since the print head according to the invention can be downsized as compared with a print head of related art, the apparatus is suitable for such demand. The portable apparatus with the invention applied can attain a greater advantage in view of the downsizing as compared with the stationary apparatus with the invention applied.

In each embodiment described above, the liquid ejecting apparatus 100 is a serial printer; however, may be a line printer.

The line printer differs from the serial printer in that it is difficult to adjust resolution by overlap printing and the like, and the nozzle density of the print head arranged in line directly affects the resolution of a print. The line printer is more demanded for the downsizing and the increase in the packing density of the print head. Since the print head according to the invention can be downsized as compared with a print head of related art, the apparatus is suitable for such demand. The line printer with the invention applied can attain a greater advantage in view of producing a print with higher resolution as compared with the serial printer with the invention applied.

What is claimed is:

1. A print head comprising:
    an ejection unit that ejects liquid when a piezoelectric element is driven;
    a driving integrated circuit that includes a circuit element and wiring, and that controls driving of the ejection unit;
    a relay substrate that transfers a signal for controlling driving of the piezoelectric element;
    an energization bump that includes a resin core and an electrode arranged on a surface of the resin core, that is located between the driving integrated circuit and the relay substrate, that is physically coupled to the driving integrated circuit and the relay substrate, and that electrically couples the driving integrated circuit and the relay substrate to each other; and
    an inspection bump that includes a resin core and an electrode arranged on a surface of the resin core, that is located between the driving integrated circuit and the relay substrate, that is physically coupled to the driving integrated circuit and the relay substrate, and that does not electrically couple the driving integrated circuit and the relay substrate to each other,
    wherein the energization bump overlaps at least one of the circuit element and the wiring, and the inspection bump does not overlap the circuit element and the wiring.

2. The print head according to claim 1, wherein the driving integrated circuit has a rectangular shape having a first short side, a second short side opposite to the first short side, a first long side, and a second long side opposite to the first long side.

3. The print head according to claim 2, wherein
    the inspection bump includes a plurality of inspection bumps,
    a first bump of the plurality of inspection bumps is located between the first short side and a first line that connects a midpoint of the first long side and a midpoint of the second long side to each other,
    a second bump of the plurality of inspection bumps is located between the first line and the second short side, and
    a line that connects the first bump and the second bump to each other is non-orthogonal to the first line.

4. The print head according to claim 3, wherein a third bump of the plurality of inspection bumps is located between a second line that passes through the first bump and that is parallel to the first short side, and a third line that passes through the second bump and that is parallel to the second short side.

5. The print head according to claim 3, wherein
    the first bump is located between the first long side and a fourth line that connects a midpoint of the first short side and a midpoint of the second short side to each other,
    the second bump is located between the fourth line and the second long side,
    a fourth bump of the plurality of inspection bumps is located between the first line and the first short side, and between the fourth line and the second long side, and
    a fifth bump of the plurality of inspection bumps is located between the first line and the second short side, and between the fourth line and the first long side.

6. The print head according to claim 2, wherein the first long side has a length that is 10 times or more a length of the first short side.

7. The print head according to claim 1, wherein a transmittance of infrared rays through a region of the driving integrated circuit where the circuit element and the wiring are not arranged is higher than a transmittance of infrared rays through a region of the driving integrated circuit where at least one of the circuit element and the wiring is arranged.

8. The print head according to claim 1, wherein the inspection bump is coupled to a non-doped region of the driving integrated circuit.

9. The print head according to claim 1, wherein the relay substrate is arranged to protect the piezoelectric element.

10. The print head according to claim 1, wherein
the relay substrate is provided with a circuit element and wiring,
the energization bump overlaps at least one of the circuit element and the wiring of the relay substrate, and
the inspection bump does not overlap the circuit element and the wiring of the relay substrate.

11. The print head according to claim 1, wherein
the ejection unit includes a plurality of ejection units, and
the plurality of ejection units are provided with a density of 300 ejection units or more per inch.

12. The print head according to claim 1, wherein the energization bump and the inspection bump protrude from the driving integrated circuit toward the relay substrate.

13. The print head according to claim 1, wherein the energization bump and the inspection bump have substantially equivalent structures and substantially equivalent sizes so that a continuity inspection between the driving integrated circuit and the relay substrate is detected by detecting a coupling state between the driving integrated circuit and the relay substrate via the inspection bump.

14. The print head according to claim 1, wherein
the resin core of the energization bump is in contact with the driving integrated circuit, and the electrode of the energization bump protrudes from the driving integrated circuit toward the relay substrate, and
the resin core of the inspection bump is in contact with the driving integrated circuit, and the electrode of the inspection bump protrudes from the driving integrated circuit toward the relay substrate.

* * * * *